United States Patent [19]

Lam et al.

[11] Patent Number: 5,084,824

[45] Date of Patent: Jan. 28, 1992

[54] SIMULATION MODEL GENERATION FROM A PHYSICAL DATA BASE OF A COMBINATORIAL CIRCUIT

[75] Inventors: Nim C. Lam; Amrit K. Lalchandani, both of Sunnyvale, Calif.

[73] Assignee: National Semiconductor Corporation, Santa Clara, Calif.

[21] Appl. No.: 502,581

[22] Filed: Mar. 29, 1990

[51] Int. Cl.[5] .............................................. G06F 15/60
[52] U.S. Cl. .................................. 364/490; 364/489; 364/488; 364/578
[58] Field of Search ............... 364/488, 489, 490, 491, 364/578; 371/23

[56] References Cited

U.S. PATENT DOCUMENTS

| | | | |
|---|---|---|---|
| 4,591,993 | 5/1986 | Griffin et al. | 364/490 |
| 4,745,084 | 5/1988 | Rowson et al. | 357/45 |
| 4,815,003 | 3/1989 | Patatunda et al. | 364/490 |
| 4,827,427 | 5/1989 | Hyduke | 364/489 |
| 4,922,432 | 5/1990 | Kobayashi et al. | 364/490 |
| 4,954,953 | 9/1990 | Bush | 364/489 |
| 4,967,367 | 10/1990 | Piednoir | 364/489 |

Primary Examiner—Parshotam S. Lall
Assistant Examiner—V. N. Trans
Attorney, Agent, or Firm—Skjerven, Morrill, MacPherson, Franklin & Friel

[57] ABSTRACT

A design layout sequence for an application specific integrated circuit such as an ECL gate array includes a schematic capture step, which results in a logic netlist file, and a placement and routing step which results in a number of various files defining, for example bias drivers, I/O macros, and relationships between chip pads and I/O signals. The design layout sequence culminates in a physical data base file. To ensure a functional design, the designer's work is simulated after both schematic capture and placement and routing using a library containing simulation models for each type of macrocell used in the design. The gate-level netlist component of the simulation models are created automatically in a computer-implemented technique that identifies each root in the combinatorial circuit, assigns each a logical value, and traverses the tree that originates from each identified root. As each tree is traversed, Boolean equations identifying the logical values at each node encountered are determined in accordance with a set of relationships pertinent to the standard circuit elements and a set of logic value assignment definitions. The resulting set of Boolean equations is used to construct the gate-level netlist that is incorporated into the simulation model of the macrocell.

11 Claims, 53 Drawing Sheets

FILE OAI32DT.HIG

```
*_NODE_AND_FUNCTION_CROSS_REFERENCE._*

*    VCC    1
  *    VSSEE  2
  *    VSSTT  3
  *    VBB3   4
  *    VCS    5
  *    C1     6
  *    B1     7
  *    VBB2   8
  *    B2     9
  *    C2    10
  *    VBB1  11
  *    A1    12
  *    A2    13
  *    ZN    14
  *    Z     15

*_ENDS_CROSS_REFERENCE_TABLE_*

*SUBCKT MACRO    C1    B1    B2    C2    A1    A2    ZN    Z
.SUBCKT MACRO     6     7     9    10    12    13    14   15

***   INPUT VOLTAGE DEFINITION   ***

VCC    1    0    0.00
VEE    2    0    'VEE'
VTT    3    0    'VTT'
VBB3   4    0    'VBB3'
VCS    5    0    'VCS'
VBB2   8    0    'VBB2'
VBB1  11    0    'VBB1'
```

©1990 National Semiconductor Corporation

FIG. 4A

**\*\*\* MACRO NET LIST PROPER \*\*\***

| | | | | |
|---|---|---|---|---|
| XQ1 | 16 | 5 | 39 | 2 S2X4 |
| XQ2 | 16 | 5 | 39 | 2 S2X4 |
| XQ3 | 17 | 5 | 40 | 2 S2X4 |
| XQ4 | 17 | 5 | 40 | 2 S2X4 |
| XQ5 | 18 | 5 | 41 | 2 S2X4 |
| XQ6 | 18 | 5 | 41 | 2 S2X4 |
| XQ7 | 1 | 6 | 19 | 2 S2.1X3 |
| XQ8 | 19 | 19 | 16 | 2 S2.1X3 |
| XQ9 | 1 | 7 | 17 | 2 S2.1X3 |
| XQ10 | 21 | 16 | 18 | 2 S2.1X3 |
| XQ11 | 22 | 4 | 18 | 2 S2.1X3 |
| XQ12 | 1 | 10 | 19 | 2 S2.1X3 |
| XQ13 | 1 | 9 | 17 | 2 S2.1X3 |
| XQ14 | 24 | 17 | 21 | 2 S2.1X3 |
| XQ15 | 25 | 8 | 21 | 2 S2.1X3 |
| XQ16 | 25 | 8 | 22 | 2 S2.1X3 |
| XQ17 | 27 | 12 | 24 | 2 S2.1X3 |
| XQ18 | 27 | 13 | 24 | 2 S2.1X3 |
| XQ19 | 28 | 11 | 24 | 2 S2.1X3 |
| XQ20 | 28 | 11 | 25 | 2 S2.1X3 |

| | | | | |
|---|---|---|---|---|
| XQ21 | 1 | 27 | 14 | 2 S2.5X5 |
| XQ22 | 1 | 28 | 15 | 2 S2.5X5 |
| RCS1 | 2 | 39 | 'RCS' | TC=-7E-4 |
| RCS2 | 2 | 40 | 'RCS' | TC=-7E-4 |
| RCS3 | 2 | 41 | 'RCS' | TC=-7E-4 |
| RCS4 | 2 | 41 | 'RTR' | TC=-7E-4 |
| REF1 | 14 | 3 | 'ROEF' | TC=4.4E-4, 5.6E-6 |
| REF2 | 15 | 3 | 'ROEF' | TC=4.4E-4, 5.6E-6 |
| RL1 | 1 | 27 | 'RL' | TC=-7E-4 |
| RL2 | 1 | 28 | 'RL' | TC=-7E-4 |
| RL3 | 1 | 27 | 'RL' | TC=-7E-4 |
| RL4 | 1 | 28 | 'RL' | TC=-7E-4 |

FIGURE 4B

```
*** PARASITIC CAPACITOR DEFINITION ***

Cp1     12    1    0.015522E-12
Cp2     13    1    0.012423E-12
Cp3      7    1    0.013766E-12
Cp4      9    1    0.011496E-12
Cp5      6    1    0.013305E-12
Cp6     10    1    0.011986E-12
Cp7     16    1    0.047764E-12
Cp8     17    1    0.041586E-12
Cp9     18    1    0.027341E-12
Cp10    19    1    0.035655E-12
Cp11    21    1    0.033798E-12
Cp12    22    1    0.014247E-12
Cp13    24    1    0.025771E-12
Cp14    25    1    0.016073E-12
Cp15    27    1    0.046058E-12
Cp16    28    1    0.045976E-12
Cp17    39    1    0.014006E-12
Cp18    40    1    0.014006E-12
Cp19    41    1    0.014006E-12
Cp20    11    1    0.065545E-12
Cp21     8    1    0.100881E-12
Cp22     4    1    0.083337E-12
Cp23     5    1    0.131281E-12
Cp24    15    1    0.023696E-12
Cp25    14    1    0.023696E-12

.ENDS MACRO
```

FIGURE 4C

FILE OAI32DT.PST
```
MACRO {
        MACRO_NAME: OAI32DT;
        NUM_CELL: 3;
        CELL_TYPE: INTERNAL;
        BASE_POWER_ALLOWED: HL;
        OPEN_INPUT: "(A1+A2)*(B1+B2)*(C1+C2)";
        OPEN_OUTPUT: "Z+ZN";
        HI_BASE_IEE: [ 0.910, 1.200, 1.510 ];
        LO_BASE_IEE: [ 0.690, 0.900, 1.140 ];
        HI_BASE_ITT: [ 0.000, 0.000, 0.000 ];
        LO_BASE_ITT: [ 0.000, 0.000, 0.000 ];
        HI_ICS: 0.6;
        LO_ICS: 0.3;
        3_LEVEL_SERIES: YES;
        PIN {
                PIN_NAME: C2;
                PIN_DIRECTION: INPUT;
                PIN_HI_DC_FANIN: 1.0;
                PIN_LO_DC_FANIN: 1.0;
                PIN_AC_FANIN: 1.0;
        }
        PIN {
                PIN_NAME: A1;
                PIN_DIRECTION: INPUT;
                PIN_HI_DC_FANIN: 2.0;
                PIN_LO_DC_FANIN: 1.0;
                PIN_AC_FANIN: 1.0;
        }
        PIN {
                PIN_NAME: A2;
                PIN_DIRECTION: INPUT;
                PIN_HI_DC_FANIN: 2.0;
                PIN_LO_DC_FANIN: 1.0;
                PIN_AC_FANIN: 1.0;
        }
        PIN {
                PIN_NAME: B1;
                PIN_DIRECTION: INPUT;
                PIN_HI_DC_FANIN: 1.0;
                PIN_LO_DC_FANIN: 1.0;
                PIN_AC_FANIN: 1.0;
        }
```

©1990 National Semiconductor Corporation

FIG. 6A

```
PIN (
        PIN_NAME: B2;
        PIN_DIRECTION: INPUT;
        PIN_HI_DC_FANIN:  1.0;
        PIN_LO_DC_FANIN:  1.0;
        PIN_AC_FANIN:     1.0;
)
PIN (
        PIN_NAME: C1;
        PIN_DIRECTION: INPUT;
        PIN_HI_DC_FANIN:  1.0;
        PIN_LO_DC_FANIN:  1.0;
        PIN_AC_FANIN:     1.0;
)
PIN (
        PIN_NAME: Z;
        PIN_DIRECTION: OUTPUT;
        PIN_FANOUT: 30;

HI_IOEF: 0.6;
        LO_IOEF: 0.3;
        OUTPUT_PIN_POWER_ALLOWED: HL;
        HI_OUTPUT_ITT: [ 0.420,  0.600,  0.780 ];
        LO_OUTPUT_ITT: [ 0.210,  0.300,  0.390 ];
)
PIN (
        PIN_NAME: ZN;
        PIN_DIRECTION: OUTPUT;
        PIN_FANOUT: 30;
        HI_IOEF: 0.6;
        LO_IOEF: 0.3;
        OUTPUT_PIN_POWER_ALLOWED: HL;
        HI_OUTPUT_ITT: [ 0.420,  0.600,  0.780 ];
        LO_OUTPUT_ITT: [ 0.210,  0.300,  0.390 ];
)
)
```

©1990 National Semiconductor Corporation

FIG. 6B

```
|                              FGA SERIES ECL GATE ARRAY   -   MACRO LIBRARY                              |
|---------------------------------------------------------------------------------------------------------|
| FUNCTION:                                                         | NAME :                              |
| 2-2-2 OR/AND/INVERT (REV 2)                                       |    OAI32DT.AC                       |
```

| | | | HIGH POWER | | | LOW POWER | | |
|---|---|---|---|---|---|---|---|---|
| PATH | EDGE | UNIT | MIN | TYP | MAX | MIN | TYP | MAX |
| TP(A1,A2-Z) | L-H | ps | 170 | 210 | 280 | 180 | 220 | 300 |
| TP(A1,A2-Z) | H-L | ps | 180 | 220 | 300 | 230 | 290 | 390 |
| TP(A1,A2-ZN) | L-H | ps | 130 | 170 | 220 | 110 | 140 | 190 |
| TP(A1,A2-ZN) | H-L | ps | 150 | 190 | 250 | 180 | 220 | 300 |
| TP(B1,B2-Z) | L-H | ps | 220 | 280 | 370 | 250 | 310 | 420 |
| TP(B1,B2-Z) | H-L | ps | 250 | 310 | 420 | 320 | 400 | 540 |
| TP(B1,B2-ZN) | L-H | ps | 190 | 230 | 310 | 170 | 210 | 280 |
| TP(B1,B2-ZN) | H-L | ps | 220 | 280 | 370 | 260 | 320 | 430 |
| TP(C1,C2-Z) | L-H | ps | 290 | 360 | 490 | 310 | 390 | 520 |
| TP(C1,C2-Z) | H-L | ps | 340 | 430 | 580 | 420 | 530 | 710 |
| TP(C1,C2-ZN) | L-H | ps | 270 | 340 | 460 | 240 | 300 | 400 |
| TP(C1,C2-ZN) | H-L | ps | 310 | 390 | 520 | 360 | 450 | 610 |

AC CHARACTERISTICS at $T_j = 0$ to $125$ C/TYP at $T_j = 25$ C:

APPLICATION NOTE: THE ABOVE DELAYS APPLY WITH ONE INPUT FROM EACH GROUP BEING USED. WHEN MORE THAN ONE INPUT IS USED IN EACH GROUP, ADD DELAYS (PER ADDITIONAL INPUT) AS FOLLOWS:

©1990 National Semiconductor Corporation

FIG. 7A

INPUT GROUPINGS:

G_1 = A1,A2
G_2 = B1,B2
G_3 = C1,C2

| PATH | EDGE | UNIT | HIGH POWER TYP | LOW POWER TYP |
|---|---|---|---|---|
| TP(A1,A2-ZN) | L-H | ps | 10/G_1 | 10/G_1 |
| TP(A1,A2-ZN) | H-L | ps | 10/G_1 | 10/G_1 |
| TP(B1,B2-Z) | L-H | ps | 10/G_2 | 20/G_2 |
| TP(B1,B2-Z) | H-L | ps | 10/G_2 | 20/G_2 |
| TP(B1,B2-ZN) | L-H | ps | 10/G_2+10/G_1 | 20/G_2+10/G_1 |
| TP(B1,B2-ZN) | H-L | ps | 10/G_2+10/G_1 | 20/G_2+10/G_1 |
| TP(C1,C2-Z) | L-H | ps | 10/G_3 | 20/G_3 |
| TP(C1,C2-Z) | H-L | ps | 10/G_3 | 20/G_3 |
| TP(C1,C2-ZN) | L-H | ps | 10/G_3+10/G_1 | 20/G_3+10/G_1 |
| TP(C1,C2-ZN) | H-L | ps | 10/G_3+10/G_1 | 20/G_3+10/G_1 |

FIG. 7B

FILE OAI32DT.VMOD

```
////////////////////////////////////////////////
module Fga_OAI32DT (C2, A1, A2, B1, B2, C1, Z, ZN);
////////////////////////////////////////////////
   output Z, ZN;
   input C2, A1, A2, B1, B2, C1;

specify
   specparam  TPLH_A1_Z    = 210,
              TPLH_A2_Z    = 210,
              TPHL_A1_Z    = 220,
              TPHL_A2_Z    = 220,
              TPLH_A1_ZN   = 170,
              TPLH_A2_ZN   = 170,
              TPHL_A1_ZN   = 190,
              TPHL_A2_ZN   = 190,
              TPLH_B1_Z    = 280,
              TPLH_B2_Z    = 280,
              TPHL_B1_Z    = 310,
              TPHL_B2_Z    = 310,
              TPLH_B1_ZN   = 230,
              TPLH_B2_ZN   = 230,
              TPHL_B1_ZN   = 280,
              TPHL_B2_ZN   = 280,
              TPLH_C1_Z    = 360,
              TPLH_C2_Z    = 360,
              TPHL_C1_Z    = 430,
              TPHL_C2_Z    = 430,
              TPLH_C1_ZN   = 340,
              TPLH_C2_ZN   = 340,
              TPHL_C1_ZN   = 390,
              TPHL_C2_ZN   = 390;
```

•1990 National Semiconductor Corporation

FIGURE 8A

```
specparam   vG1     = 1;//#of_connects (A1,A2)
specparam   vG2     = 1;//#of_connects (B1,B2)
specparam   vG1_G2  = 1;//#of_connects (A1,A2)
specparam   vG3     = 1;//#of_connects (C1,C2)
specparam   vG1_G3  = 1;//#of_connects (A1,A2)

specparam   iLH_vG1_ZN  = 10;
specparam   iHL_vG1_ZN  = 10;
specparam   iLH_vG2_Z   = 10;
specparam   iHL_vG2_Z   = 10;
specparam   iLH_vG2_ZN  = 10;
specparam   iHL_vG2_ZN  = 10;
specparam   iLH_vG1_G2_ZN = 10;
specparam   iHL_vG1_G2_ZN = 10;
specparam   iLH_vG3_Z   = 10;
specparam   iHL_vG3_Z   = 10;
specparam   iLH_vG3_ZN  = 10;
specparam   iHL_vG3_ZN  = 10;
specparam   iLH_vG1_G3_ZN = 10;
specparam   iHL_vG1_G3_ZN = 10;

specparam   RISE_Z   = 0,
            FALL_Z   = 0,
            RISE_ZN  = 0,
            FALL_ZN  = 0;

(A1 => Z) = (TPLH_A1_Z+RISE_Z,
             TPHL_A1_Z+FALL_Z);
```

FIG. 8B

```
(A2 => Z) = (TPLH_A2_Z+RISE_Z,
              TPHL_A2_Z+FALL_Z);
(A1 => ZN) = (TPLH_A1_ZN+RISE_ZN+(vG1-1)*iLH_vG1_ZN,
              TPHL_A1_ZN+FALL_ZN+(vG1-1)*iHL_vG1_ZN);
(A2 => ZN) = (TPLH_A2_ZN+RISE_ZN+(vG1-1)*iLH_vG1_ZN,
              TPHL_A2_ZN+FALL_ZN+(vG1-1)*iHL_vG1_ZN);
(B1 => Z)  = (TPLH_B1_Z+RISE_Z+(vG2-1)*iLH_vG2_Z,
              TPHL_B1_Z+FALL_Z+(vG2-1)*iHL_vG2_Z);
(B2 => Z)  = (TPLH_B2_Z+RISE_Z+(vG2-1)*iLH_vG2_Z,
              TPHL_B2_Z+FALL_Z+(vG2-1)*iHL_vG2_Z);
(B1 => ZN) = (TPLH_B1_ZN+RISE_ZN+(vG2-1)*iLH_vG2_ZN+(vG1_G2-1)*iLH_vG1_G2_ZN,
              TPHL_B1_ZN+FALL_ZN+(vG2-1)*iHL_vG2_ZN+(vG1_G2-1)*iHL_vG1_G2_ZN);
(B2 => ZN) = (TPLH_B2_ZN+RISE_ZN+(vG2-1)*iLH_vG2_ZN+(vG1_G2-1)*iLH_vG1_G2_ZN,
              TPHL_B2_ZN+FALL_ZN+(vG2-1)*iHL_vG2_ZN+(vG1_G2-1)*iHL_vG1_G2_ZN);
(C1 => Z)  = (TPLH_C1_Z+RISE_Z+(vG3-1)*iLH_vG3_Z,
              TPHL_C1_Z+FALL_Z+(vG3-1)*iHL_vG3_Z);
(C2 => Z)  = (TPLH_C2_Z+RISE_Z+(vG3-1)*iLH_vG3_Z,
              TPHL_C2_Z+FALL_Z+(vG3-1)*iHL_vG3_Z);
(C1 => ZN) = (TPLH_C1_ZN+RISE_ZN+(vG3-1)*iLH_vG3_ZN+(vG1_G3-1)*iLH_vG1_G3_ZN,
              TPHL_C1_ZN+FALL_ZN+(vG3-1)*iHL_vG3_ZN+(vG1_G3-1)*iHL_vG1_G3_ZN);
(C2 => ZN) = (TPLH_C2_ZN+RISE_ZN+(vG3-1)*iLH_vG3_ZN+(vG1_G3-1)*iLH_vG1_G3_ZN,
              TPHL_C2_ZN+FALL_ZN+(vG3-1)*iHL_vG3_ZN+(vG1_G3-1)*iHL_vG1_G3_ZN);
endspecify
```

FIG. 8C

```
or      (N_1, B2, B1);
or      (N_2, C2, C1);
and     (N_4, A2, N_1, N_2);
and     (N_8, A1, N_1, N_2);
nor #1  (ZN, N_4, N_8);

or  #1  (Z, N_4, N_8);

endmodule // Fga_OAI32DT
```

FIG. 8D

File 0A132DT.OUT
MACRO: 0AI32DT
POWER: HIGH

```
ORIGINAL INPUT LIST
-----------------------------
VCC    I   1
VSSEE  I   2
VSSTT  I   3
VBB3   I   4
VCS    I   5
C1     I   6
B1     I   7
VBB2   I   8
B2     I   9
C2     I  10
VBB1   I  11
A1     I  12
A2     I  13
ZN     I  14
Z      I  15
XQ1    S  16    5   39
XQ2    S  16    5   39
XQ3    S  17    5   40
XQ4    S  17    5   40
XQ5    S  18    5   41
XQ6    S  18    5   41
XQ7    S   1    6   19
XQ8    S  19   19   16
XQ9    S   1    7   17
XQ10   S  21   16   18
XQ11   S  22    4   18
XQ12   S   1   10   19
XQ13   S   1    9   17
XQ14   S  24   17   21
XQ15   S  25    8   21
XQ16   S  25    8   22
XQ17   S  27   12   24
XQ18   S  27   13   24
XQ19   S  28   11   24
XQ20   S  28   11   25
XQ21   S   1   27   14
XQ22   S   1   28   15
RCS1   L   2   39
RCS2   L   2   40
RCS3   L   2   41
RCS4   L   2   41
REF1   L  14    3
REF2   L  15    3
RL1    L   1   27
RL2    L   1   28
RL3    L   1   27
```

FIG. 9A

©1990 National Semiconductor Corporation

Power list
---------------

```
VCC     1
VSSEE   2
VSSTT   3
VBB3    4
VCS     5
VBB2    8
VBB1    11
1   2   3   5   11

OEF list
----------------
XQ21    1   27  14
XQ22    1   28  15

Output pin list
----------------
ZN      14
Z       15

List with REF and OEF
----------------------
VCC    P    1
VSSEE  P    2
VSSTT  P    3
VBB3   P    4
VCS    P    5
C1     I    6
B1     I    7
VBB2   P    8
B2     I    9
C2     I    10
VB31   P    11
A1     I    12
A2     I    13
ZN     O    14
Z      O    15
XQ1    S    16    5    39
XQ3    S    17    5    40
XQ5    S    18    5    41
XQ7    S    1     6    19
XQ8    S    19   19    16
XQ9    S    1     7    17
XQ10   S    21   16    18
XQ11   S    22    4    18
XQ12   S    1    10    19
XQ13   S    1     9    17
XQ14   S    24   17    21
XQ15   S    25    8    21
XQ16   S    25    8    22
XQ17   S    27   12    24
XQ18   S    27   13    24
XQ19   S    28   11    24
XQ20   S    28   11    25
```

FIG. 9B

```
XQ21    F    1   27   14
XQ22    F    1   28   15
RCS1    L    2   39
RCS2    L    2   40
RCS3    L    2   41
REF1    E   14    3
REF2    E   15    3
RL1     L    1   27
RL2     L    1   28

Output Pin Records
-----------------------
ZN       27
Z        28

Translator with corresponding input transistors
-----------------------------------------------
VCC     P    1
VSSEE   P    2
VSSTT   P    3
VB33    P    4
VCS     P    5
C1      I    6
B1      I    7
VB32    P    8
B2      I    9
C2      I   10
VB31    P   11
A1      I   12
A2      I   13
ZN      O   14
Z       O   15
XQ1     U   16    5   39
XQ3     U   17    5   40
XQ5     T   18    5   41
XQ7     N    1    6   19
XQ8     D   19   19   16
XQ9     S    1    7   17
XQ10    S   21   16   18
XQ11    S   22    4   18
XQ12    N    1   10   19
XQ13    S    1    9   17
XQ14    S   24   17   21
XQ15    S   25    8   21
XQ16    S   25    8   22
XQ17    S   27   12   24
XQ18    S   27   13   24
XQ19    S   28   11   24
XQ20    S   28   11   25
XQ21    F    1   27   14
XQ22    F    1   28   15
RCS1    L    2   39
RCS2    L    2   40
RCS3    L    2   41
RL1     L    1   27
RL2     L    1   28
```

FIG. 9C

Output port
--------------------
XQ10 G 21 16 18 logic = -1 input name(s): C1+C2

Translator with corresponding input transistors
-----------------------------------------------
```
VCC    P  1
VSSEE  P  2
VSSTT  P  3
VBB3   P  4
VCS    P  5
C1     A  6
à1     I  7
VBB2   P  8
à2     I  9
C2     A  10
VBB1   P  11
A1     I  12
A2     I  13
ZN     O  14
Z      O  15
XQ1    U  16  5   39
XQ3    U  17  5   40
XQ5    T  18  5   41
XQ9    N  1   7   17
XQ10   G  21  16  18
XQ11   S  22  4   18
XQ13   N  1   9   17
XQ14   S  24  17  21
XQ15   S  25  8   21
XQ16   S  25  8   22
XQ17   S  27  12  24
XQ18   S  27  13  24
XQ19   S  28  11  24
XQ20   S  28  11  25
XQ21   F  1   27  14
XQ22   F  1   28  15
RCS1   L  2   39
RCS2   L  2   40
RCS3   L  2   41
RL1    L  1   27
RL2    L  1   28
```
Output port
--------------------
XQ14 G 24 17 21 logic = -1 input name(s): B1+B2

List before datalist()
----------------------
```
VCC    P  1
VSSEE  P  2
VBB3   P  4
VCS    P  5
C1     A  6
à1     A  7
VBB2   P  8
```

FIG. 9D

```
B2     A  9
C2     A  10
VBB1   P  11
A1     I  12
A2     I  13
ZN     O  14
Z      O  15
XQ5    T  18   5   41
XQ10   G  21   16  18
XQ11   S  22   4   18
XQ14   G  24   17  21
XQ15   S  25   8   21
XQ16   S  25   8   22
XQ17   S  27   12  24
XQ18   S  27   13  24
XQ19   S  28   11  24
XQ20   S  28   11  25
XQ21   F  1    27  14
XQ22   F  1    28  15
RCS3   L  2    41
RL1    L  1    27
RL2    L  1    28
```

DATA LIST

```
1     VCC_P    RL1_A    RL2_A
2     VSSEE_P  RCS3_A
4     XQ11_B
5     XQ5_B
8     XQ15_B   XQ16_B
11    XQ19_B   XQ20_B
12    XQ17_B
13    XQ18_B
16    XQ10_B
17    XQ14_B
18    XQ5_C    XQ10_E   XQ11_E
21    XQ10_C   XQ14_E   XQ15_E
22    XQ11_C   XQ16_E
24    XQ14_C   XQ17_E   XQ18_E   XQ19_E
25    SP25_S   XQ15_C   XQ16_C   XQ20_E
27    SP27_S   XQ17_C   XQ18_C   XQ21_B   RL1_D
28    SP28_S   XQ19_C   XQ20_C   XQ22_B   RL2_D
41    XQ5_E    RCS3_D
```

NODE LOGIC STRING

```
VSSEE_P  1              ——— 110
RCS3_A   1              ——— 111
RCS3_D   1              ——— 112
XQ5_E    1              ——— 113
XQ5_B    1              ——— 114
XQ5_C    1              ——— 115
XQ10_E   1              ——— 116
XQ11_E   1              ——— 117
XQ10_B   C1+C2          ——— 118
XQ10_C   C1+C2          ——— 119
XQ11_B   (C1+C2)'       ——— 120
```

FIG. 9E

| Signal | Expression | # |
|---|---|---|
| XQ11_C | (C1+C2)' | 121 |
| XQ14_E | C1+C2 | 122 |
| XQ15_E | C1+C2 | 123 |
| XQ16_E | (C1+C2)' | 124 |
| XQ14_B | B1+B2 | 125 |
| XQ14_C | (C1+C2)*(B1+B2) | 126 |
| XQ15_B | (B1+B2)' | 127 |
| XQ15_C | (C1+C2)*((B1+B2)') | 128 |
| XQ16_B | 1 | 129 |
| XQ16_C | (C1+C2)' | 130 |
| XQ17_E | (C1+C2)*(B1+B2) | 131 |
| XQ18_E | (C1+C2)*(B1+B2) | 132 |
| XQ19_E | (C1+C2)*(B1+B2) | 133 |
| SP25_S | (C1+C2)*((B1+B2)')+(C1+C2)' | 134 |
| XQ17_B | A1 | 135 |
| XQ17_C | ((C1+C2)*(B1+B2))*(A1) | 136 |
| XQ18_B | A2 | 137 |
| XQ18_C | ((C1+C2)*(B1+B2))*(A2) | 138 |
| XQ19_B | (A1+A2)' | 139 |
| XQ19_C | ((C1+C2)*(B1+B2))*((A1+A2)') | 140 |
| XQ20_E | (C1+C2)*(B1+B2)')+(C1+C2) | 141 |
| SP27_S | ((C1+C2)*(B1+B2))*(A1)+((C1+C2)*(B1+B2))*(A2) | 142 |
| XQ20_B | 1 | 143 |
| XQ20_C | (C1+C2)*((B1+B2)')+(C1+C2)' | 144 |
| XQ21_B | ((C1+C2)*(B1+B2))*(A1)+((C1+C2)*(B1+B2))*(A2) | 145 |
| RL1_D | ((C1+C2)*(B1+B2))*(A1)+((C1+C2)*(B1+B2))*(A2) | 146 |
| SP28_S | ((C1+C2)*(B1+B2))*((A1+A2)')+(C1+C2)*((B1+B2)')+(C1+C2) | 147 |
| XQ22_B | ((C1+C2)*(B1+B2))*((A1+A2)')+(C1+C2)*((B1+B2)')+(C1+C2) | 148 |
| RL2_D | ((C1+C2)*(B1+B2))*((A1+A2)')+(C1+C2)*((B1+B2)')+(C1+C2) | 149 |

FIG. 9F

OUTPUT LOGIC STRING
----------------------------------------
ZN   (((C1+C2)*(B1+B2))*(A1)+((C1+C2)*(B1+B2))*(A2))'        —150
Z    (((C1+C2)*(B1+B2))*((A1+A2)')+((C1+C2)*((B1+B2)')+(C1+C2)') —151

TRUTH TABLE READ IN FROM FILE "OAI32DT.TRU"
----------------------------------------
| A1 | A2 | B1 | B2 | C1 | C2 | Z | ZN |
|----|----|----|----|----|----|---|----|
| L  | L  | H  | L  | H  | H  | L | H  |
| H  | H  | L  | H  | H  | L  | L | H  |
| H  | L  | H  | H  | L  | L  | L | H  |
| L  | H  | L  | H  | L  | H  | H | L  |

TRUTH TABLE GENERATED BY PROGRAM
----------------------------------------
| A1 | A2 | B1 | B2 | C1 | C2 | ZN | Z |
|----|----|----|----|----|----|----|---|
| L  | L  | H  | L  | H  | H  | H  | L |
| H  | H  | L  | H  | H  | L  | H  | L |
| H  | L  | H  | H  | L  | L  | H  | L |
| L  | H  | L  | H  | L  | H  | L  | H |

INDIVIDUAL NODE
------------------------------------

```
Nodename:  VCC_P
Nodeid:    MALE
Circ_Node: 1
Logicstr:
Father:
Fath-Son:
Brother:
Child:
Sister:
Cousin:
Husband:   -1
Bachelor:  -1
Logic_Val: -1

Nodename:  RL1_A
Nodeid:    MALE
Circ_Node: 1
Logicstr:
Father:
Fath-Son:
Brother:
Child:
Sister:
Cousin:
Husband:   -1
Bachelor:  -1
Logic_Val: -1
```

FIG. 9H

```
Nodename:   RL2_A
Nodeid:     MALE
Circ_Node:  1
Logicstr:
Father:
Fath-Son:
Brother:
Child:
Sister:
Cousin:
Husband:    -1
Bachelor:   -1
Logic_Val:  -1

Nodename:   VSSEE_P
Nodeid:     ROOT
Circ_Node:  2
Logicstr:   1
Father:
Fath-Son:
Brother:
Child:      RCS3_A
Sister:
Cousin:
Husband:    -1
```

FIG. 9I

```
Bachelor:    -1
Logic_Val:   1

Nodename:    RCS3_A
Nodeid:      MALE
Circ_Nods:   2
Logicstr:    1
Father:      VSSEE_P
Fath-Son:    ADOPT
Brother:
Child:       RCS3_D
Sister:
Cousin:
Husband:     -1
Bachelor:    -1
Logic_Val:   1

Nodename:    XQ11_B
Nodeid:      FEMALE
Circ_Node:   4
Logicstr:    (C1+C2)'
Father:      XQ11_E
Fath-Son:    BLOOD
Brother:     XQ11_C
Child:
Sister:
Cousin:
Husband:     -1
Bachelor:    -1
Logic_Val:   0
```

FIG. 9J

```
Nodename:  XQ5_B
Nodeid:    FEMALE
Circ_Node: 5
Logicstr:  1
Father:    XQ5_E
Fath-Son:  BLOOD
Brother:   XQ5_C
Child:
Sister:
Cousin:
Husband:   -1
Bachelor:  -1
Logic_Val: 1

Nodename:  XQ15_B
Nodeid:    FEMALE
Circ_Node: 9
Logicstr:  (B1+B2)'
Father:    XQ15_E
Fath-Son:  BLOOD
Brother:   XQ15_C
Child:
Sister:
Cousin:
Husband:   -1
Bachelor:  -1
Logic_Val: 0

Nodename:  XQ16_B
```

FIG. 9K

```
Nodeid:      FEMALE
Circ_Node:   8
Logicstr:    1
Father:      XQ16_E
Fath-Son:    BLOOD
Brother:     XQ16_C
Child:
Sister:
Cousin:
Husband:     -1
Bachelor:    -1
Logic_Val:   1
Nodename:    XQ19_B
Nodeid:      FEMALE
Circ_Node:   11
Logicstr:    (A1+A2)'
Father:      XQ19_E
Fath-Son:    BLOOD
Brother:     XQ19_C
Child:
Sister:
Cousin:
Husband:     -1
Bachelor:    -1
Logic_Val:   0
Nodename:    XQ20_B
Nodeid:      FEMALE
Circ_Node:   11
Logicstr:    1
Father:      XQ20_E
Fath-Son:    BLOOD
Brother:     XQ20_C
Child:
Sister:
Cousin:
Husband:     -1
Bachelor:    -1
Logic_Val:   1
Nodename:    XQ17_B
Nodeid:      FEMALE
Circ_Node:   12
Logicstr:    A1
Father:      XQ17_E
Fath-Son:    BLOOD
Brother:     XQ17_C
Child:
Sister:
Cousin:
Husband:     -1
Bachelor:    -1
Logic_Val:   -1
Nodename:    XQ18_B
Nodeid:      FEMALE
Circ_Node:   13
Logicstr:    A2
Father:      XQ18_E
```

FIG. 9L

```
Fath-Son:    BLOOD
Brother:     XQ18_C
Child:
Sister:
Cousin:
Husband:     -1
Bachelor:    -1
Logic_Val:   -1

Nodename:    XQ10_B
Nodeid:      FEMALE
Circ_Node:   16
Logicstr:    C1+C2
Father:      XQ10_E
Fath-Son:    BLOOD
Brother:     XQ10_C
Child:
Sister:
Cousin:
Husband:     -1
Bachelor:    -1
Logic_Val:   -1
```

FIG. 9M

```
Nodename:  XQ14_B
Nodeid:    FEMALE
Circ_Node: 17
Logicstr:  B1+B2
Father:    XQ14_E
Fath-Son:  BLOOD
Brother:   XQ14_C
Child:
Sister:
Cousin:
Husband:   -1
Bachelor:  -1
Logic_Val: -1

Nodename:  XQ5_C
Nodeid:    MALE
Circ_Node: 18
Logicstr:  1
Father:    XQ5_E
Fath-Son:  BLOOD
Brother:
Child:     XQ10_E  XQ11_E
Sister:    XQ5_B
Cousin:
Husband:   -1
Bachelor:  -1
Logic_Val: 1

Nodename:  XQ10_E
Nodeid:    MALE
Circ_Node: 18
Logicstr:  1
Father:    XQ5_C
Fath-Son:  ADOPT
Brother:   XQ11_E
Child:     XQ10_B  XQ10_C
Sister:
```

FIG. 9N

```
Cousin:
Husband:   -1
Bachelor:  -1
Logic_Val: 1

Nodename:  XQ11_E
Nodeid:    MALE
Circ_Node: 18
Logicstr:  1
Father:    XQ5_C
Fath-Son:  ADOPT
Brother:   XQ10_E
Child:     XQ11_B  XQ11_C
Sister:
Cousin:
Husband:   -1
Bachelor:  -1
Logic_Val: 1

Nodename:  XQ10_C
Nodeid:    MALE
Circ_Node: 21
Logicstr:  C1+C2
Father:    XQ10_E
Fath-Son:  BLOOD
Brother:
Child:     XQ14_E  XQ15_E
Sister:    XQ10_B
Cousin:
Husband:   -1
Bachelor:  -1
Logic_Val: 1
```

FIG. 9O

```
Nodename:   XQ14_E
Nodeid:     MALE
Circ_Node:  21
Logicstr:   C1+C2
Father:     XQ10_C
Fath-Son:   ADOPT
Brother:    XQ15_E
Child:      XQ14_B  XQ14_C
Sister:
Cousin:
Husband:    -1
Bachelor:   -1
Logic_Val:  1

Nodename:   XQ15_E
Nodeid:     MALE
Circ_Node:  21
Logicstr:   C1+C2
Father:     XQ10_C
Fath-Son:   ADOPT
Brother:    XQ14_E
Child:      XQ15_B  XQ15_C
Sister:
Cousin:
Husband:    -1
Bachelor:   -1
Logic_Val:  1
```

FIG. 9P

```
Nodename:   XQ11_C
Nodeid:     MALE
Circ_Node:  22
Logicstr:   (C1+C2)'
Father:     XQ11_E
Fath-Son:   BLOOD
Brother:
Child:      XQ16_E
Sister:     XQ11_B
Cousin:
Husband:    -1
Bachelor:   -1
Logic_Val:  0

Nodename:   XQ16_E
Nodeid:     MALE
Circ_Node:  22
Logicstr:   (C1+C2)'
Father:     XQ11_C
Fath-Son:   ADOPT
Brother:
Child:      XQ16_B  XQ16_C
Sister:
Cousin:
Husband:    -1
Bachelor:   -1
Logic_Val:  0
```

FIG. 9Q

```
Nodename:   XQ14_C
Nodeid:     MALE
Circ_Node:  24
Logicstr:   (C1+C2)*(B1+B2)
Father:     XQ14_E
Fath-Son:   BLOOD
Brother:
Child:      XQ17_E  XQ18_E  XQ19_E
Sister:     XQ14_B
Cousin:
Husband:    -1
Bachelor:   -1
Logic_Val:  1

Nodename:   XQ17_E
Nodeid:     MALE
Circ_Node:  24
Logicstr:   (C1+C2)*(B1+B2)
Father:     XQ14_C
Fath-Son:   ADOPT
Brother:    XQ18_E  XQ19_E
Child:      XQ17_B  XQ17_C
Sister:
Cousin:
Husband:    -1
Bachelor:   -1
Logic_Val:  1

Nodename:   XQ18_E
Nodeid:     MALE
Circ_Node:  24
```

FIG. 9R

```
Logicstr: (C1+C2)*(B1+B2)
Father:   XQ14_C
Fath-Son: ADOPT
Brother:  XQ17_E  XQ19_E
Child:    XQ18_B  XQ18_C
Sister:
Cousin:
Husband:  -1
Bachelor: -1
Logic_Val: 1

Nodename: XQ19_E
Nodeid:   MALE
Circ_Node: 24
Logicstr: (C1+C2)*(B1+B2)
Father:   XQ14_C
Fath-Son: ADOPT
Brother:  XQ17_E  XQ18_E
Child:    XQ19_B  XQ19_C
Sister:
Cousin:
Husband:  -1
Bachelor: -1
Logic_Val: 1
```

FIG. 9S

```
Nodename:   SP25_S
Nodeid:     SPNODE
Circ_Node:  25
Logicstr:   (C1+C2)*((B1+B2)')+(C1+C2)'
Father:     XQ15_C
Fath-Son:
Brother:
Child:      XQ20_E
Sister:
Cousin:
Husband:    -1
Bachelor:   -1
Logic_Val:  0

Nodename:   XQ15_C
Nodeid:     MALE
Circ_Node:  25
Logicstr:   (C1+C2)*((B1+B2)')
Father:     XQ15_E
Fath-Son:   BLOOD
Brother:
Child:      SP25_S
Sister:     XQ15_B
Cousin:     XQ16_C
Husband:    -1
Bachelor:   -1
Logic_Val:  0

Nodename:   XQ16_C
Nodeid:     MALE
Circ_Node:  25
Logicstr:   (C1+C2)'
Father:     XQ16_E
Fath-Son:   BLOOD
Brother:
```

FIG. 9T

```
Child:      SP25_S
Sister:     XQ16_b
Cousin:     XQ15_C
Husband:    -1
Bachelor:   -1
Logic_Val:  0

Nodename:   XQ20_E
Nodeid:     MALE
Circ_Node:  25
Logicstr:   (C1+C2)*((B1+B2)')+(C1+C2)'
Father:     SP25_S
Fath-Son:   ADOPT
Brother:
Child:      XQ20_B XQ20_C
Sister:
Cousin:
Husband:    -1
Bachelor:   -1
Logic_Val:  0

Nodename:   SP27_S
Nodeid:     SPNODE
Circ_Node:  27
Logicstr:   ((C1+C2)*(B1+B2))*(A1)+((C1+C2)*(B1+B2))*(A2)
Father:     XQ17_C
Fath-Son:
Brother:
Child:      XQ21_B RL1_D
Sister:
Cousin:
Husband:    -1
Bachelor:   -1
Logic_Val:  1
```

FIG. 9U

```
Nodename:   XQ17_C
Nodeid:     MALE
Circ_Node:  27
Logicstr:   ((C1+C2)*(B1+B2))*(A1)
Father:     XQ17_E
Fath-Son:   BLOOD
Brother:
Child:      SP27_S
Sister:     XQ17_B
Cousin:     XQ18_C
Husband:    -1
Bachelor:   -1
Logic_Val:  1

Nodename:   XQ18_C
Nodeid:     MALE
Circ_Node:  27
Logicstr:   ((C1+C2)*(B1+B2))*(A2)
Father:     XQ18_E
Fath-Son:   BLOOD
Brother:
Child:      SP27_S
Sister:     XQ18_B
Cousin:     XQ17_C
Husband:    -1
```

FIG. 9V

```
Bachelor:    -1
Logic_Val:    1

Nodename:   XQ21_B
Nodeid:     PRSON
Circ_Node:  27
Logicstr:   (((C1+C2)*(B1+B2))*(A1)+(((C1+C2)*(B1+B2))*(A2)
Father:     SP27_S
Fath-Son:   ADOPT
Brother:
Child:
Sister:
Cousin:
Husband:    -1
Bachelor:   -1
Logic_Val:   1

Nodename:   RL1_D
Nodeid:     MALE
Circ_Node:  27
Logicstr:   (((C1+C2)*(B1+B2))*(A1)+(((C1+C2)*(B1+B2))*(A2)
Father:     SP27_S
Fath-Son:   ADOPT
Brother:
Child:
Sister:
Cousin:
Husband:    -1
Bachelor:   -1
Logic_Val:   1
```

FIG. 9W

```
Nodename:   SP28_S
Nodeid:     SPNODE
Circ_Node:  28
Logicstr:   (((C1+C2)*(B1+B2))*((A1+A2)')+(C1+C2)*((B1+B2)'))+(C1+C2)'
Father:     XQ19_C
Fath-Son:
Brother:
Child:      XQ22_B  RL2_D
Sister:
Cousin:
Husband:    -1
Bachelor:   -1
Logic_Val:  0

Nodename:   XQ19_C
Nodeid:     MALE
Circ_Node:  28
Logicstr:   ((C1+C2)*(B1+B2))*((A1+A2)')
Father:     XQ19_E
Fath-Son:   BLOOD
Brother:
Child:      SP28_S
Sister:     XQ19_B
Cousin:     XQ20_C
Husband:    -1
Bachelor:   -1
Logic_Val:  0

Nodename:   XQ20_C
```

FIG. 9X

```
Nodeid:      MALE
Circ_Node:   28
Logicstr:    ((C1+C2)*((B1+B2)')+(C1+C2)'
Father:      XQ20_E
Fath-Son:    BLOOD
Brother:
Child:       SP28_S
Sister:      XQ20_B
Cousin:      XQ19_C
Husband:     -1
Bachelor:    -1
Logic_Val:   0

Nodename:    XQ22_B
Nodeid:      PRSON
Circ_Node:   28
Logicstr:    (((C1+C2)*(B1+B2))*((A1+A2)')+(C1+C2)*((B1+B2)')+(C1+C2)'
Father:      SP28_S
Fath-Son:    ADOPT
Brother:
Child:
Sister:
Cousin:
Husband:     -1
Bachelor:    -1
Logic_Val:   0
```

FIG. 9Y

```
Nodename:   RL2_D
Nodeid:     MALE
Circ_Node:  28
Logicstr:   ((C1+C2)*(B1+B2))*((A1+A2)')+(C1+C2)*((B1+B2)')+(C1+C2)'
Father:     SP26_S
Fath-Son:   ADOPT
Brother:
Child:
Sister:
Cousin:
Husband:    -1
Bachelor:   -1
Logic_Val:  0

Nodename:   XQ5_E
Nodeid:     MALE
Circ_Node:  41
Logicstr:   1
Father:     RCS3_D
Fath-Son:   ADOPT
Brother:
Child:      XQ5_B  XQ5_C
Sister:
Cousin:
Husband:    -1
Bachelor:   -1
Logic_Val:  1

Nodename:   RCS3_D
Nodeid:     MALE
Circ_Node:  41
Logicstr:   1
Father:     RCS3_A
```

FIG. 9Z

```
Fath-Son:   BLOOD
Brother:
Child:      XQ5_E
Sister:
Cousin:
Husband:    -1
Bachelor:   -1
Logic_Val:  1
```

DEPTH-FIRST TRAVERSAL
----------------------
```
Nodename:   VSSEE_P
Nodename:   RCS3_A
Nodename:   RCS3_D
Nodename:   XQ5_E
Nodename:   XQ5_C
Nodename:   XQ11_E
Nodename:   XQ11_C
Nodename:   XQ16_E
Nodename:   XQ16_C
Nodename:   XQ16_B
Nodename:   XQ11_B
Nodename:   XQ10_E
Nodename:   XQ10_C
Nodename:   XQ15_E
Nodename:   XQ15_C
Nodename:   SP25_S
Nodename:   XQ20_E
Nodename:   XQ20_C
Nodename:   XQ20_B
Nodename:   XQ15_B
Nodename:   XQ14_E
Nodename:   XQ14_C
Nodename:   XQ19_E
Nodename:   XQ19_C
Nodename:   SP28_S
Nodename:   RL2_D
Nodename:   XQ22_B
Nodename:   XQ19_B
Nodename:   XQ18_E
Nodename:   XQ18_C
Nodename:   XQ18_B
Nodename:   XQ17_E
Nodename:   XQ17_C
Nodename:   SP27_S
Nodename:   RL1_D
Nodename:   XQ21_B
Nodename:   XQ17_B
Nodename:   XQ14_B
Nodename:   XQ10_B
Nodename:   XQ5_B
```

BREADTH-FIRST TRAVERSAL
------------------------

FIG. 9AA

```
Nodename: VSSEE_P
Nodename: RCS3_A
Nodename: RCS3_D
Nodename: XQ5_E
Nodename: XQ5_B
Nodename: XQ5_C
Nodename: XQ10_E
Nodename: XQ11_E
Nodename: XQ10_B
Nodename: XQ10_C
Nodename: XQ11_B
Nodename: XQ11_C
Nodename: XQ14_E
Nodename: XQ15_E
Nodename: XQ16_E
Nodename: XQ14_B
Nodename: XQ14_C
Nodename: XQ15_B
Nodename: XQ15_C
Nodename: XQ16_B
Nodename: XQ16_C
Nodename: XQ17_E
Nodename: XQ18_E
Nodename: XQ19_E
Nodename: SP25_S
Nodename: XQ17_B
Nodename: XQ17_C
Nodename: XQ18_B
Nodename: XQ18_C
Nodename: XQ19_B
Nodename: XQ19_C
Nodename: XQ20_E
Nodename: SP27_S
Nodename: SP28_S
Nodename: XQ20_B
Nodename: XQ20_C
Nodename: XQ21_B
Nodename: RL1_D
Nodename: XQ22_B
Nodename: RL2_D
```

FIG. 9AB

```
FINAL LIST
------------------------
VCC    P   1
VSSEE  P   2
VBB3   B   4
VCS    B   5
C1     A   6
B1     A   7
VBB2   B   8
B2     A   9
C2     A   10
VBB1   B   11
A1     I   12
A2     I   13
ZN     O   14
Z      O   15
XQ5    T   18    5   41
XQ10   G   21   16   18
XQ11   S   22    4   18
```

FIG. 9AC

```
XQ14    G    24    17    21
XQ15    S    25     8    21
XQ16    S    25     8    22
XQ17    S    27    12    24
XQ18    S    27    13    24
XQ19    S    28    11    24
XQ20    S    28    11    25
XQ21    F     1    27    14
XQ22    F     1    28    15
RCS3    R     2    41
RL1     L     1    27
RL2     L     1    28
----- ZN -----

Before reducing:
    or      (N_1, B2, B1);              ——— 180
    or      (N_2, C2, C1);              ——— 182
    and     (N_3, N_1, N_2);            ——— 184
    and     (N_4, A2, N_3);             ——— 186
    or      (N_5, B2, B1);              ——— 188
    or      (N_6, C2, C1);              ——— 190
    and     (N_7, N_5, N_6);
    and     (N_8, A1, N_7);
    or      (N_9, N_4, N_8);            ——— 192
    not #1  (ZN, N_9);                  ——— 194

H
        H
        H  }                            ——— 200
        L
        L

After reducing:
    or      (N_1, B2, B1);
    or      (N_2, C2, C1);
    and     (N_4, A2, N_1, N_2);        ——— 196
    and     (N_8, A1, N_1, N_2);
    nor #1  (ZN, N_4, N_8);             ——— 198

H
        H
        H  }                            ——— 202
        L
        L

----- Z -----

Before reducing:
    or      (N_11, C2, C1);
    not     (N_12, N_11);
    or      (N_13, B2, B1);
    not     (N_14, N_13);
    or      (N_15, C2, C1);
    and     (N_16, N_14, N_15);
    or      (N_17, N_12, N_16);
```

FIG. 9AD

```
   or     (N_18, A2, A1);
   not    (N_19, N_18);
   or     (N_20, B2, B1);
   or     (N_21, C2, C1);
   and    (N_22, N_20, N_21);
   and    (N_23, N_19, N_22);
   or     (N_24, N_17, N_23);
   not #1 (Z, N_24);

L ⎫
        L ⎪
        L ⎬ ─────────────────── 204
        H ⎪
        H ⎭

After reducing:
   or     (N_11, C2, C1);
   not    (N_12, N_11);
   or     (N_13, B2, B1);
   not    (N_14, N_13);
   and    (N_16, N_14, N_11);
   or     (N_18, A2, A1);
   not    (N_19, N_18);
   and    (N_23, N_19, N_13, N_11);
   nor #1 (Z, N_12, N_10, N_23);

L ⎫
        L ⎪
        L ⎬ ─────────────────── 206
        H ⎪
        H ⎭

Netlists put in Verilog model file
-----------------------------------
   or     (N_1, B2, B1);  ⎫
   or     (N_2, C2, C1);  ⎪
   and    (N_4, A2, N_1, N_2); ⎬ ── 208
   and    (N_8, A1, N_1, N_2); ⎪
   nor #1 (ZN, N_4, N_8);      ⎭ or #1  (Z, N_4, N_8);  ──────── 210

Vector File Before Sorting:
A1  A2  B1  B2  C1  C2
0   0   1   1   1   1
1   1   0   0   1   1
1   1   1   1   0   0
1   0   1   0   1   0
0   1   0   1   0   1

Vector File After Sorting:

| A1 | A2 | B1 | B2 | C1 | C2 |
|----|----|----|----|----|----|
| 0  | 0  | 1  | 1  | 1  | 1  |
| 1  | 1  | 0  | 0  | 1  | 1  |
| 1  | 1  | 1  | 1  | 0  | 0  |
| 1  | 0  | 1  | 0  | 1  | 0  |
| 0  | 1  | 0  | 1  | 0  | 1  |

| Z | ZV |
|---|----|
| 0 | 1  |
| 0 | 1  |
| 0 | 1  |
| 1 | 0  |
| 1 | 0  |

FIG. 9AF

FILE: OAI32DT.VEC

```
! MACRO: OAI32DT
!
! AABBCC  ZZ
! 121212  N
!
$F IIIIII  00
   001111  01
   110011  01
   111100  01
   101010  10
   010101  10
   010101  10
```

FIG. 10

©1990 National Semiconductor Corporation

FILE: OAI32DT.EQN

```
cell   Fga_OAI32DT;
output Z, ZN;
input  C2, A1, A2, B1, B2, C1;

ZN   = (((C1+C2)*(B1+B2))*(A1)+((C1+C2)*(B1+B2)*(A2));
Z    = (((C1+C2)*(B1+B2))*(A1+A2)')+(C1+C2)*((B1+B2)')+(C1+C2)'');
```

©1990 National Semiconductor Corporation

FIG. 12

FILE OAI32DT.VTB

```
// OAI32DT.VTB
module Test_OAI32DT();
  reg  A1,A2,B1,B2,C1,C2;
  wire Z,ZN;
  Fga_OAI32DT Instance1(
    .Z(Z),.ZN(ZN),
    .A1(A1),.A2(A2),.B1(B1),.B2(B2),.C1(C1),
    .C2(C2) );
  initial
  begin
    $display ("                 *Time* AABBCC ZZ");
    $display ("                        121212  N");
    $display ("                                  ");
    $fc_compareon;
    repeat (6)
    begin
      $fc_readvec ("oai32dt.vec",
      {A1,A2,B1,B2,C1,C2},
      {Z,ZN});
      #100000;
    end
  end
  initial
  begin
    $monitor($time,,
      A1,A2,B1,B2,C1,C2,,
      Z,ZN);
  end
/*
  // UNCOMMENT THIS BLOCK FOR GRAPHICS initial
  begin
    $gr_waves(
    "Z",Z,"ZN",ZN,
    "A1",A1,"A2",A2,"B1",B1,"B2",B2,"C1",C1,
    "C2",C2);
  end
*/ endmodule
```

©1990 National Semiconductor Corporation

FIG. 11

| Relationships pertinent to the 'transistor' and the 'resistor' |
|---|

89: For the resistor, the terminal closer to the 'root' is the 'father' and the other terminal is the 'son'.

90: For the transistor, the emitter is the 'father', the base is the 'daughter' and the collector is the 'son'.

| Logical value assignment definitions ( LV ) |
|---|

91: Resistor : LV of son = LV of father

92: Transistor : LV of collector = LV of emitter X LV of base

93: LV of 'root' = 1

94: LV of VCS ( bias signal for current source ) = 1

95: LV of VBB ( bias signal for current switch ) = complement of the LV of the base of the switching transistor of the same current switch 96: Supernode ( node with multiple collectors ) :
LV of Supernode = 'OR' of the LV's of collectors at that node 97: Input translator ( IT ) : If the IT has one input, then the base of the transistor tied to the input translator has a LV = LV of that input.

98: If the IT has multiple inputs, then the base of the transistor tied to the IT has a LV = 'OR' of the LV of each input 99: Output emitter follower ( OEF ) : LV of the output is the complement of the LV of the base of the output transistor.

FIG. 13

300: EXTRACTION OF PARALLEL TRANSISTORS AND RESISTORS

302: READ VERTICES OF AN INSTANCE IN NETLIST
304:    SCAN DOWN NETLIST
306:       EXTRACT SUBSEQUENT INSTANCE WITH SAME VERTICES
308:       RETURN

320: PREPROCESS OUTPUT EMITTER FOLLOWERS

322: IDENTIFY A MACROCELL OUTPUT
324:    SEARCH FOR TIED EMITTER
326:       SEARCH FOR ASSOCIATED BASE
328:          APPEND BASE NODE NUMBER TO OEF NODE TABLE
330:          RETURN
332:       SEARCH FOR ASSOCIATED RESISTOR INSTANCE
334:          SEARCH FOR R INSTANCE HAVING SHARED NODE
336:             EXTRACT R INSTANCE
338:          EXTRACT ASSOCIATED RESISTOR INSTANCE
340:          RETURN
342:       RETURN
344: RETURN

360: PREPROCESS INPUT TRANSLATORS

362: IDENTIFY EACH FALSE ROOT
364:    ASSIGN ROOT NUMBER
366:    RETURN
368: PROCESS TREE FOR EACH FALSE ROOT
370:    IDENTIFY TRANSLATOR OUTPUT
372:    RESET LV(PORT)
374:    SEARCH FOR TIED BASE
376:       LV(PORT) = LV(PORT) + LV(TIED_BASE)
378:       RETURN
380:    EXTRACT INSTANCES FORMING IDENTIFIED TRANSLATOR
382:    RETURN

©1990 National Semiconductor Corporation

FIG. 14

```
400:    IDENTIFY EACH TRUE ROOT
402:        ASSIGN ROOT NUMBER
404:        ASSIGN LV = 1
406:        RETURN
410:    PROCESS TREE FOR EACH TRUE ROOT
412:        SEARCH FOR NEXT CIRCUIT NODE/SUPERNODE
414:            IF NO TIE TO RL/OEF/VCC01
416:                SEARCH FOR CONNECTED FATHER VERTEX
418:                    ASSIGN LV(VERTEX) = LV(NODE/SUPERNODE)
420:                    IF RESISTOR VERTEX
422:                        ASSIGN LV(SON) = LV(FATHER)
424:                        RETURN
426:                    IF TRANSISTOR EMITTER VERTEX
428:                        SEARCH FOR ASSOCIATED BASE
430:                            IF TIED TO PORT, LV(B) = LV(PORT)
432:                            IF TIED TO VBB,  LV(B) = LV'(PORT)
434:                            IF TIED TO VCS,  LV(B) = 1
436:                            RETURN
438:                        LV(C) = LV(E) + LV(B)
440:                        SEARCH FOR ASSOCIATED COLLECTOR
442:                            ID NODE AS SUPERNODE
444:                            LV(SUPERNODE) = LV(SUPERNODE) + LV(C)
446:                            RETURN
448:                        RETURN
450:                    RETURN
452:                RETURN
454:            IF TIED TO BASE OF OEF
456:                LV(OEF-BASE) = LV(NODE/SUPERNODE)
458:                LV(OEF-OUTPUT) = LV'(OEF-BASE)
460:                RETURN
462:            RETURN
464:        RETURN
```

©1990 National Semiconductor Corporation

FIGURE 15

SIMULATION MODEL GENERATION FROM A PHYSICAL DATA BASE OF A COMBINATORIAL CIRCUIT

REFERENCE TO MICROFICHE APPENDIX

A computer program listing consisting of a total of 3 microfiche and a total of 210 frames and referenced herein as "the Appendix" was submitted to the Patent and Trademark Office as a microfiche appendix to this patent document, and hereby is incorporated herein by reference. The microfiche appendix contains 23 Parts, as follows:

| Part 1: | XTRACTNET.C | Part 2: | DEF.H |
|---|---|---|---|
| Part 3: | PROTO.H | Part 4: | ADD.C |
| Part 5: | AF.C | Part 6: | CU.C |
| Part 7: | GAT.C | Part 8: | GS.C |
| Part 9: | MOD.C | Part 10: | RED.C |
| Part 11: | TB.C | Part 12: | TREE.C |
| Part 13: | VEC.C | Part 14: | VLOG.C |
| Part 15: | OAI55DT.HIG | Part 16: | OAI55DT.TRU |
| Part 17: | OAI55DT.PST | Part 18: | OAI55DT.AC |
| Part 19: | OAI55DT.VMOD | Part 20: | OAI55DT.OUT |
| Part 21: | OAI55DT.VEC | Part 22: | OAI55DT.VTB |
| Part 23: | OAI55DT.EQN | | |

FACSIMILE REPRODUCTION AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to computer aided design of electronic circuits; and more particularly to the generation of a gate-level netlist that is suitable for use in a simulation model of a combinatorial circuit, from the physical database of the circuit.

2. Description of Related Art

The high cost of integrated circuit design has led to the development of circuits that are customized to perform a user-defined function. This class of circuits includes the gate array, which is an integrated circuit that includes an array of unwired logic gates that are customized at the metallization mask stage.

The design and layout sequence 930 for a customer designed gate array, which generally is known as a customer "option," is illustrated in FIG. 1. Integrated systems for performing the design and layout sequence of FIG. 1 are generally available, and include the FAIRCAD (Trademark) system of National Semiconductor Corporation, Santa Clara, Calif.

The design and layout sequence 930 generally begins with a schematic capture step 910 and the generation of logic netlist 912. The logic netlist 912 is a logic level description of the customer option, specifying the names of each individual occurrence or "instance" of macrocells in the customer option, pin utilization, and connectivity between the various macrocell instances. In the FAIRCAD system, the filename of the logic netlist 912 is GENNET.LIS. In performing the schematic capture step 910, the option designer works with a predetermined set of logical element symbols, interconnecting each instance of a logic element in the customer option as desired and specifying parameters for each instance. These parameters include power requirements and number of inputs and outputs desired. Schematic capture software suitable for operation on workstations or general purpose computers is separately available from such vendors as, for example, Silvar-Lisco, Inc. of Sunnyvale, Calif.

A pre-layout simulation 914 preferably is performed on the logic netlist 912 to confirm the logic functionality of the customer option. The simulation 914 uses gate-level simulation models for each type of macrocell in the macrocell library 902. These models, which are stored in a simulation model library 926, contain logic and timing information. If the logic functionality is not satisfactory, the customer option is modified as necessary by repeating the schematic capture step 910. Another prelayout simulation is performed on the modified logic netlist 912 to confirm the logic functionality of the redesigned customer option. Suitable simulation software systems for use on workstations or general purpose computers include the FAIRLOGS (Trademark) system, which is part of the FAIRCAD system available from National Semiconductor Corporation; and the VERILOGS (Trademark) system, available from Gateway Design Automation Corp., Westford, Mass.

Once the logic functionality of the customer option is confirmed, a placement and routing operation 916 is performed on the customer option, as represented in the logic netlist 912 Several files result from the placement and routing step 916, the most notable of which are a physical connectivity data file 917, a file 918 that provides the bias driver identification associated with every macro instance in the customer option, a file 919 that specifies the names of input I/O macro instances of the customer option using pulldown resistors, and a file 920 that specifies the pad-to-signal name relationships for the customer option. In the FAIRCAD system, these files are known as DESIGN.DFF, DESIGN.BOV, DESIGN.MVA, AND XXAUTOPIN.S50 respectively. The physical connectivity data file 917, the bias driver identification file 918, and the I/O macro pulldown resistor definition file 919 are used in a post-processing step 922, discussed below. The pad—I/O signal relationship file 920 is generally used in a test verification operation that occurs after fabrication of the customer option. Placement and routing software systems for use on workstations or general purpose computers are available separately, and include the GARDS system available from Silvar-Lisco, Inc.

A post-layout simulation preferably is then done to confirm the timing characteristics of the physical connectivity, which is modified as necessary in an iterative process involving placement and routing step 916 and post-layout simulation step 921. The simulation 921 uses gate-level simulation models for each type of macrocell in the macrocell library 902. These models, which are stored in a simulation model library 926, contain logic and timing information. The previously mentioned FAIRLOGS system and VERILOGS system are suitable for use in post-layout simulation.

Once the physical connectivity of the file 917 is confirmed, the physical connections are "databased" from the physical connectivity data file 917 in a post-processing operation 922 to produce a physical data base 924. The physical data base 924 preferably is produced in a suitable industry standard format, such as the CV format of the Computervision Corporation of Bedford, Mass. which is now a division of Prime Computer, Inc.; the APL format of the CAD/CAM Division of Schlumberger Technologies, Inc., Ann Arbor, Mich.; and the GDS format of the Calma Company of San Diego, Calif., now a division of Prime Computer, Inc.

The post-processing operation 922 requires many input files. Some of these input files are physical data base files contained in several different libraries. One set of input files is found in the macrocell library 902. The files of this set are for the various types of macrocells corresponding to the logic elements made available to the option designer. A macrocell is an elementary circuit used as a building block in the design of ASIC chips such as gate arrays and standard cells, and may have various power and input/output configurations. Macrocell libraries are available from a number of manufacturers, including National Semiconductor Corporation, which describes an ECL family of macrocells in a publication entitled FGA Series Macro Library for AS-PECT (Trademark) ECL Gate Arrays, Revision No. 0.3, 1989. Another set of input files is found in the overlay library 904. The files of this set are for various metallization and contact layer definitions used in customizing an instance of a macrocell to a selected power configuration. Another set of input files is found in the bias generator library 906. The files of this set are for various standard bias generators.

Some of the input files to the post processing step 922 are generated in the placement and routing step 916, as described above. One of these files is the physical connectivity file 917 (DESIGN.DFF). Another input file, the bias driver identification file 918 (DESIGN.BOV), contains an identification of the bias netlist utilized by each single macro instance. Another input file, the I/O macro pulldown file 919 (DESIGN.MVA), defines the pulldown resistor utilization of the various input macros.

The macrocell library 902, the overlay library 904, and the bias generator library 906 generally are created as follows. A circuit level netlist is prepared, either by being written directly by an engineer or generated automatically from a circuit schematic prepared by an engineer. The macrocell is laid out using computer tools, such as, for example, the SCALD (Trademark) system with the LED and LED2STREAM software, which is available from Valid Logic Systems, Inc. of San Jose, Calif. The resulting physical data base is compared with the circuit level netlist, also commonly with computer tools, to ensure consistency in continuity. Commercially available software suitable for performing the comparison includes the "Layout versus Schematic" system available from Cadence Design Systems, Inc. of Santa Clara, Calif.; and the "Network Consistency Check" system available from Silvar-Lisco, Inc.

A gate-level simulation model of a macrocell for the library 926 generally comprises a gate-level netlist combined with other information. This other information is obtained from several macrocell-specific files, including a user-furnished truth table for the macrocell, a text file specifying characteristics of the macrocell specific to the fabrication technology in use, and an AC delay specification for the various I/O paths in the circuit. The "fabrication technology" file contains such information as currents, allowable power combinations, open input equations, open output equations, and information about the macrocell inputs and outputs such as fan-in, fan-out, and pin power attributes. The preparation of this file may be manual or automated, as is known in the art. The AC delay specification of a circuit may be obtained by simulating the macrocell with a suitable analog simulator such as the SPICE software system, available from various vendors as well as from the University of California at Berkeley, and modifying the specification in accordance with actual measurements of the macrocell performance obtained from integrated circuits.

The gate-level netlist itself may in simple cases be directly written, but usually is generated from a logic schematic of the macrocell using a suitable software system such as the SDS software system available from Silvar-Lisco, Inc., installed on a workstation or general purpose computer In either case, the generation of the gate-level netlist is time intensive, costly, and subject to error, and the results do not necessarily have a one-to-one correspondence with the physical layout of the macrocell and are not necessarily reproducible by different engineers.

SUMMARY OF THE INVENTION

The present invention provides a technique for generating a gate-level netlist that is suitable for use in a simulation model of a combinatorial circuit, from the physical database of the circuit. The invention achieves automation of the gate-level netlist generation, thereby reducing time to market, enhancing accuracy, and providing consistency between the simulation model and the physical layout.

These and other advantages are achieved by the present invention, which generates a gate-level netlist for a macrocell simulation model from a physical layout of said macrocell. A circuit-level netlist is generated from a physical layout of the macrocell. Each true root present in the circuit-level netlist is identified. For each true root identified, successive circuit nodes of a tree associated with the root are identified from the circuit-level netlist; and for each successive circuit node, a Boolean equation is determined in accordance with a set of relationship rules pertinent to circuit elements of the macrocell and a set of logical value assignment definition rules. As the identified circuit nodes includes a set of output nodes, the Boolean equations for these output nodes are converted into a gate-level netlist.

BRIEF DESCRIPTION OF THE DRAWINGS

In the drawings, where like reference numerals indicate like parts,

FIGS. 4A-4C are file listings (OAI32DT.HIG) of a SPICE netlist;

FIGS. 6A and 6B are file listings (OAI32DT.PST) of information used to check I/O pin names.

FIGS. 7A and 7B are file listings (OAI32DT.AC) of information used to extract AC values;

FIG.8-8D are file listings (OAI32DT.VMOD) of a Verilog simulation mode file;

FIGS. 9A-9Z and 9AA-9AF are file listings (OAI32DT.OUT) of the program-generated truth table, as well as warning and error messages, component data, and intermediate information useful in debugging;

FIG. 10 is a file listing (OAI32DT.VEC) of vectors for testing the Verilog simulation model file;

FIG. 11 is a file listing (OAI32DT.VTB) of information for testing the Verilog simulation model file;

FIG. 12 is a file listing (OAI32DT.EQN) OF logic equations for the outputs;

FIG. 13 is a listing of relationship rules and logic value assignment rules;

FIG. 14 is a pseudocode listing of a SPICE netlist preprocessor;

FIG. 15 is a psuedocode listing of a treeroot generator; and

DESCRIPTION OF THE PREFERRED EMBODIMENT

Figure 1:
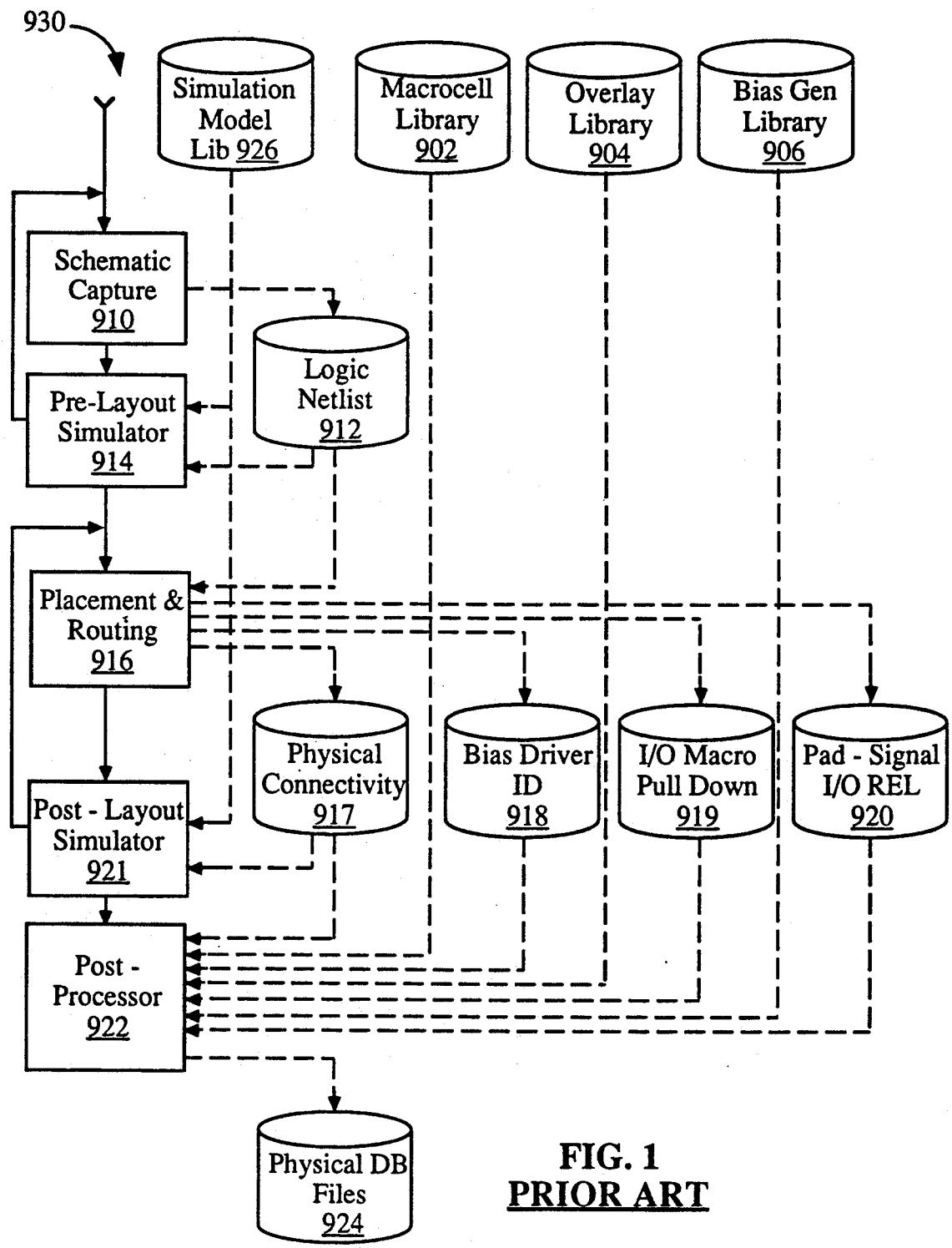
FIG. 1 is a flow diagram showing process flow and data flow for a prior art integrated circuit design sequence.
Figure 2:
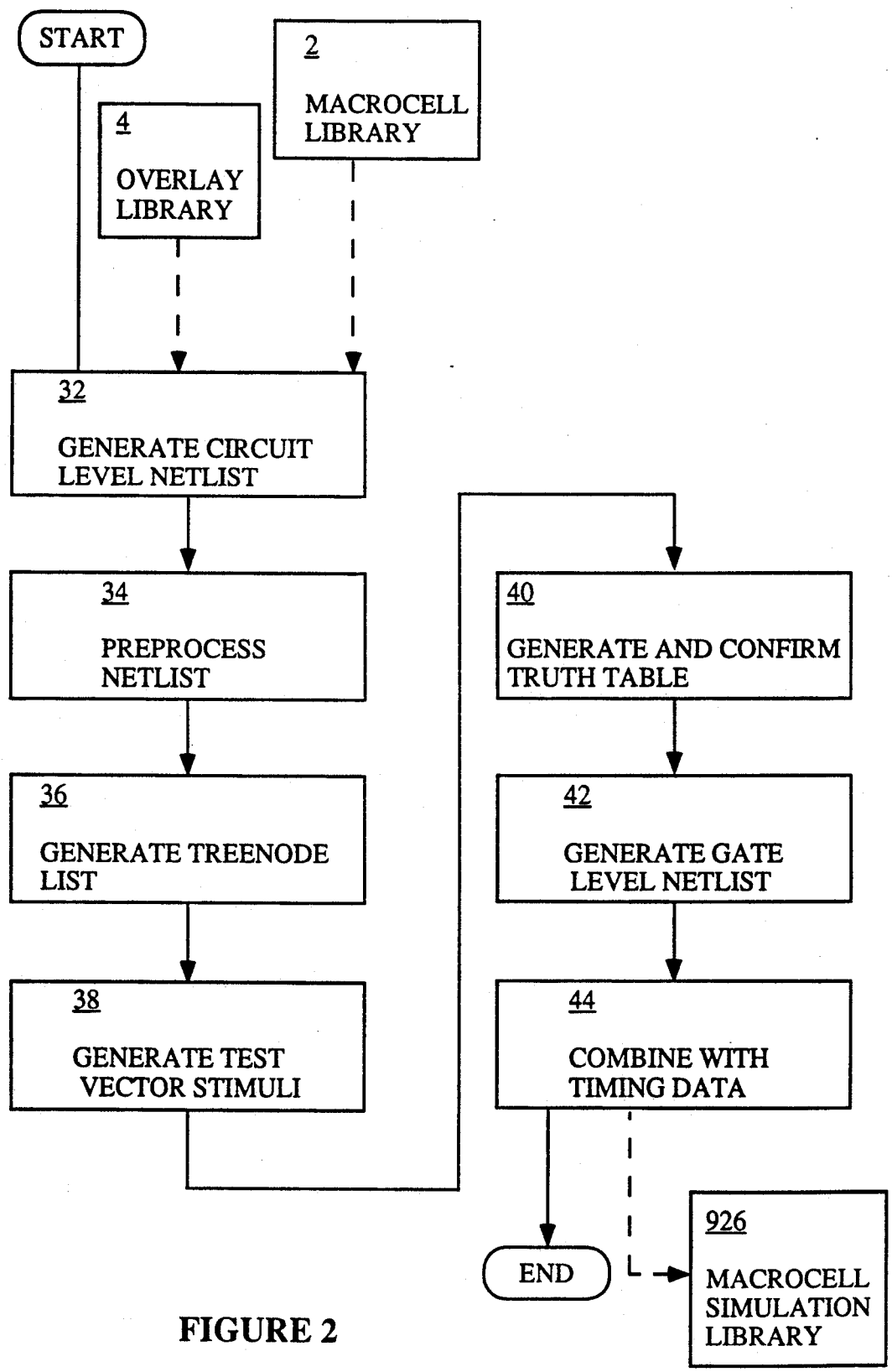
FIG. 2 is a flow diagram showing process flow and data flow for a gate-level simulation model generation sequence, in accordance with the present invention.

FIG. 2 illustrates a method for generating a gate-level simulation model of a given macrocell for the simulation model library 926, from the physical data base of the macrocell as obtained from the macrocell library 2 and the overlay library 4. First, a circuit-level netlist is generated in step 32 from the physical data base of the macrocell, which includes the basic physical data base from the macrocell library 2 and the physical data base for the selected power option from the overlay library 4. Software systems for performing netlist generation are available, and include the ERC and DMPDVC systems from Silvar Lisco, Inc. The ERC system produces a binary netlist, from which an ASCII level netlist is obtained using the DMPDVC system. The output files include an ASCII netlist file, a file of capacitance values, and a cross-reference file. These files are fully explained in the user manual for the ERC and DMPDVC systems, available from Silvar-Lisco, Inc.

Figure 3:
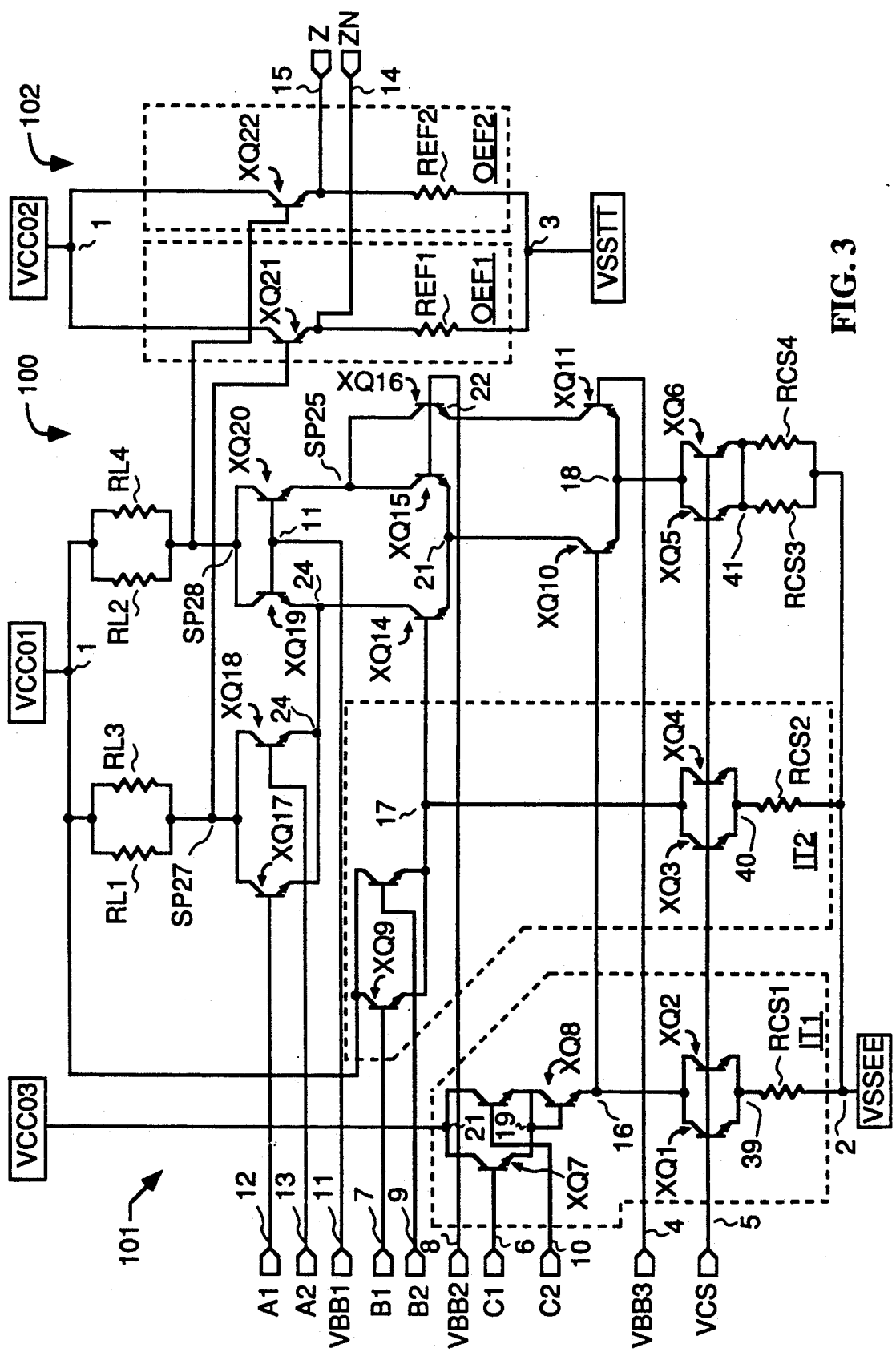
FIG. 3 is a circuit schematic of an exemplary macrocell.
Figure 5:
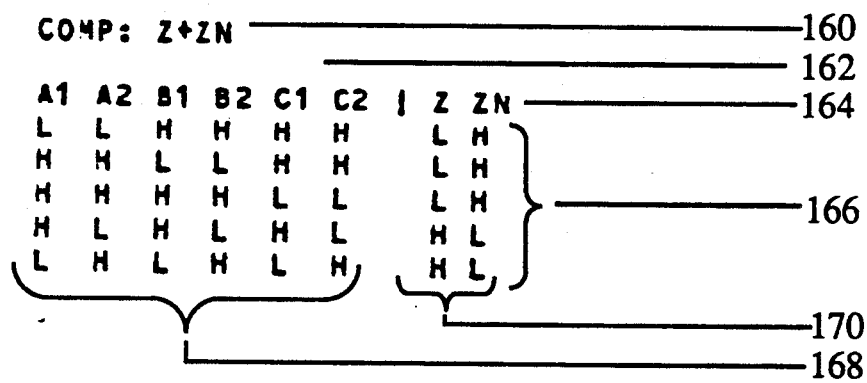
FIG. 5 is a file listing (OAI32DT.TRU) of a user-furnished truth table.

The ASCII netlist file is processed to obtain a SPICE netlist file defining all of the electrical circuit elements and their interconnections. An example of a SPICE netlist file OAI32DT.HIG, which is one of the macrocells in the FGA Series Macro Library for ASPECT (Trademark) ECL Gate Arrays available from National Semiconductor Corporation, is shown in FIG. 4. The macroname OAI32DT means an OR-AND-INVERT macro with six inputs and two outputs, and the suffix HIG means high power option. A circuit schematic of the SPICE netlist of FIG. 4 is illustrated in FIG. 3.

The SPICE netlist generation is done by program XTRACTNET.C, which is listed in Part 1 of the Appendix. Program XTRACTNET.C accepts the ASCII netlist file (assigned filename macroname.DEV), the capacitance value file (assigned filename macroname.CAP), and the cross reference file (assigned filename macroname.XRF) as its inputs. Program XTRACT-NET.C is provided with models of various ECL components, and associates the appropriate ECL component model with each component extracted from the physical data base to produce a SPICE netlist file macroname.LIS. The file macroname.LIS is renamed later as file macroname.HIG for a high power option, and macroname.LOW for a low power option. For example, the SPICE netlist file OAI32DT.HIG listed in FIG. 4 associates transistor XQ1 with model S2X4, transistor XQ10 with model S2.1X3, and resistor RCS1 elements in a resistor type RCS and a temperature coefficient of TC=−7E-4. If it is desired to provide nonstandard macrocell, such as, for example, undefined or high impedance outputs or if the macrocell is sequential on some inputs and outputs, the SPICE netlist file may be modified manually as necessary.

The automatic Verilog model generation program VLOG.C, which is listed in Parts 2-14 of the Appendix, uses the following input files.

TABLE 1

| macroname.HIG | Contains the SPICE netlist file (may have suffix .LOW). |
|---|---|
| macroname.TRU | Contains a user furnished truth table suitable for generation of a vector file. |
| macroname.PST | Contains information specifying the characteristics of the macrocell specific to the fabrication technology in use and I/O information. |
| macroname.AC | AC delay specification for the various I/O paths in the circuit. |

Examples of the SPICE netlist file OAI32DT.HIG, the truth table file OAI32DT.TRU, the pin name file OAI32DT.PST, and the AC file OAI32DT.AC are listed in FIGS. 4, 5, 6 and 7 respectively File OAI32DT.PST is created when the physical data base of the macrocell is generated, as previously described; and file OAI32DT.AC results from the macrocell analog simulation, as previously described. Program VLOG.C generates the following output files.

TABLE 2

| macroname.VMOD | Contains the Verilog simulation model file. |
|---|---|
| macroname.OUT | An intermediate file containing the program-generated truth table, as well as warning and error messages, component data, and other intermediate information useful in debugging. |
| macroname.VEC | Contains vectors for testing the Verilog simulation model file. This file is not used in the simulation of customer options. |
| macroname.VTB | Contains information for testing the Verilog simulation model file. This file is not used in the simulation of customer options. |
| macroname.EQN | An intermediate file containing logic equations for the outputs, using only NOT, AND, and OR gates. |

Examples of the Verilog simulation model file OAI32DT.VMOD, the truth table and intermediate information file OAI32DT.OUT, the test vector file OAI32DT.VEC, the test information file OAI32DT.VTB, and the logic equation file OAI32D-T.EQN are given in FIGS. 8, 9, 10, 11 and 12 respectively. The file macroname.VMOD containing the Verilog simulation model is added to the macrocell simulation library 26.

Program VLOG.C is based on the recognition that certain combinatorial circuits such as, for example, ECL ("Emitter Coupled Logic") circuits, have components arranged in very specific relationships. An ECL circuit, for example, can be viewed as a tree structure, starting from a single "root" or, in some circuits, multiple roots at source VSSEE and expanding in branches to the ports of the circuit. Accordingly, program VLOG.C identifies each root in the combinatorial circuit, assigns each a logical value, and traverses the tree that originates from each identified root. As each tree is traversed, Boolean equations identifying the logical value at each node encountered are determined in accordance with a set of relationships pertinent to the standard circuit elements and a set of logic value assignment definitions. The resulting set of Boolean equations is used to construct the gate level simulation model of the macrocell. A suitable set of relationships and a suitable set of logic value assignment definitions ("LV") for ECL circuits are shown in FIG. 13.

The operation of the program VLOG.C is summarized in steps 34, 36, 38, 40, 42 and 44 of FIG. 2. In describing the operation of the program VLOG.C, reference will be made to the SPICE netlist of FIG. 4 and to various lists in the intermediate file OAI32DT.-OUT. The components and nodes referenced may be seen schematically in FIG. 3.

The SPICE netlist file is preprocessed in step 34 to extract parallel transistors and resistors and to reduce the output emitter followers and the input translators. The operation and general content of the program VLOG.C insofar as pertinent to the preprocessing of the SPICE netlist is shown in FIG. 14, which shows a sequence 300 for extracting parallel transistors and resistors, a sequence 320 for preprocessing the output emitter followers, and a sequence 360 for preprocessing the input translators.

Parallel transistors and resistors are extracted as follows. At each instance in the SPICE netlist of FIG. 4B, the vertices are read (302) and the netlist is scanned (304). Subsequent instances with the same vertices are extracted (306). For example, transistor XQ5 is retained while transistor XQ6 is extracted, and resistor RCS3 is retained while resistor RCS4 is extracted. The results of the sequence 300 are stored as an intermediate file; see list "Final List" of the file OAI32DT.OUT, which is shown in FIGS. 9AB and 9AC.

Output emitter followers are extracted from the SPICE netlist as follows. The SPICE netlist is searched for an output node (322); see list "Output Pin List" of the intermediate file OAI32DT.OUT, which is shown in FIG. 9B. When one is found, the SPICE netlist is searched for an emitter tied to the identified output node (324). For each tied emitter, an associated base is identified (326) and added to a table (328); see list "OEF List" of the intermediate file OAI32DT.OUT, which is shown in FIG. 9B. For each tied emitter, an associated resistor instance is identified (332), any resistor sharing a node with it is extracted (336), and the associated resistor instance is then extracted (340). For example, resistors REF1 and REF2 are extracted. Note that REF1 and REF2 have no other resistors tied to common nodes. These steps are repeated for each tied emitter to an identified macrocell output, and for each macrocell output in the SPICE netlist.

Input translators are extracted from the SPICE netlist as follows. The SPICE netlist is searched for its false roots (362), which are assigned false root numbers (364) for processing purposes. Each tree from a false root is processed in turn. First, its translator output is identified (370); for example, nodes 16 and 17 shown in FIG. 3 are translator outputs. The translator output is assigned a logical value in accordance with the inputs to the translator. This value is determined by identifying the input ports associated with the translator output through the tied bases (374) and ORing together the input ports connected to the tied bases (376). For example, node 16 is assigned the logical value (C1+C2). When the SPICE netlist has been processed for all tied bases, all instances forming the input translator tree are extracted (380).

Step 36 of the method of FIG. 2 is the generation of a Boolean equation table from the preprocessed SPICE netlist of step 34. As the Boolean equation table provides an expression for each node of the tree, it is also known as a treenode list. The treenode list obtained from the preprocessed SPICE netlist "Final List" of FIGS. 9Ac and 9AD for macrocell OAI32DT is shown in FIGS. 9G under the titles "Node Logic String" and "Output Logic String."

The operation and general content of program VLOG.C pertinent to generation of the treenode list of FIGS. 9AC and 9AD is illustrated in FIG. 15. The roots of the main circuit branches, which are known as "true" roots, are identified and assigned root numbers and logical values in steps 400-406. The tree for each true node is processed node by node in steps 410-464; a list of circuit nodes and the vertices associated therewith for the macrocell OAI32DT is provided in FIG. 9E under the heading "Data List."

The tree processing sequence 410 begins with the step of searching for the next circuit node or supernode (412). A node is the connection of two or more component vertices, while a "supernode" is a node to which two or more collectors are connected. The "next" circuit node or supernode is searched for in accordance with either a depth-first traversal of the preprocessed netlist, which preferentially searches for vertically-related nodes, or a breadth-first traversal of the preprocessed netlist, which preferentially searches for horizontally-related nodes. For example, the results of depth-first and breadth-first traversal are listed in FIGS. 9AA and 9AB respecitvely, under the appropriate heading, for the circuit OAI32DT. The treenode lists of FIGS. 9E-9F were produced for the circuit OAI32DT using depth-first traversal.

Having searched for and identified the next circuit node, the treenode list generator illustrated in FIG. 15 next completes a logical value assignment for components connected to the identified node but not tied to a load resistor, a base of an output emitter follower transistor, or VCC01 (414). A "father" vertex connected to the identified node is selected and assigned the logical value of the node (steps 416 and 418; see "Data List" of FIG. 9E). A father vertex is either a resistor vertex closest to the root, or an emitter vertex of a transistor. If the father vertex is a resistor vertex, then the logical value of the resistor vertex farthest from the root (the "son" vertex) is the logical value of the father vertex in accordance with rules 89 and 91 of FIG. 13, as shown in steps 420-424. If the father vertex is an emitter vertex, then the logical value of the collector vertex is the AND of the logical values of the emitter and base vertices in accordance with rules 90 and 92 of FIG. 13, as shown in steps 426-438. The logical value of the base vertices is determined in accordance with rules 97, 98, 94 and 95 of FIG. 13, as shown in steps 430-434.

A search also is made to determine whether the collector of any other transistor is associated with (connected to) the identified node (440). If so, the identified node is identified as a supernode (442) and the logical value of the collector vertex is ORed to the previously determined partial logical value for the identified supernode (or to zero if none) to form a new partial logical value for the identified supernode.

On the other hand, if the identified next circuit node is tied to the base of a transistor in an output emitter follower (454), the tied base is assigned the logical value of the identified node or supernode (456). The output of the associated output emitter follower is assigned the complement of the logical value of the output emitter follower base (458).

On the other hand, if the identified next circuit node is tied to a load resistor or VCC and not tied to a base of an output emitter follower transistor, no further processing of that branch is done.

To better appreciate the operation illustrated in FIG. 15, consider generating a gate-level netlist of the macrocell OAI32DT shown schematically in FIG. 3. Macrocell OAI32DT has a main segment comprising a current switch circuit segment 100, a first auxiliary branch 101 that includes input translators IT1 and IT2, and a second auxiliary branch 102 that includes output emitter followers OEF1 and OEF2. Main branch 100 has a root, the circuit supply voltage VSSEE, which is identified in step 400. The macrocell of FIG. 3 has only a single root, as roots are identified only for the main branch or branches of a circuit and not for auxiliary branches. Assigning root VSSEE a value of logical ONE (404), the method progresses through the branches of the circuit 100 to the terminals and applies the device relationships and logical value assignment definitions of FIG. 13 in order to obtain the node logic string assignments and the output logic string assignments of FIGS. 9E-9G.

The root assignment of 1 (line 110) is made in accordance with rule 93. The next element encountered is current source resistor RCS3, which includes two resistors in parallel. Resistor RCS3 is a two terminal device defined by relationship 89: the father terminal connected to the root is forced to the value 1 (line 111), and the value of the son terminal is determined to be 1 (line 112) per rule 91. The next element encountered is switching transistor XQ5. Transistor XQ5 is a three terminal device defined by relationship 90: the emitter "father" connected to resistor RCS3 is forced to the value 1 (line 113), the base "daughter" is forced to the value 1 (line 114) as it is connected to the bias signal terminal VCS which is assigned the value 1 per rule 94, and the value of the collector "son" is determined to be 1 (line 115) per rule 92.

Switching transistors XQ10 and XQ11 are next encountered as the circuit 100 branches. The emitters of XQ10 and XQ11 are forced to 1 (lines 116 and 117). The base of XQ10 is assigned the value C1+C2 (line 118) per rule 98, as it is connected to the input translator IT1 with multiple inputs C1 and C2. Accordingly, the value at the collector of XQ10 is determined to be C1+C2 (line 119), in accordance with rule 92. The base of XQ11 is assigned the value (C1+C2)' (line 120) per rule 95, as it is connected to bias signal VBB3 and is part of the same current switch as transistor XQ10. Accordingly, the value at the collector of XQ11 is determined to be (C1+C2)' (line 121), in accordance with rule 92.

Switching transistors XQ14 and XQ15 are next encountered as the circuit 100 branches from the collector of XQ10. The emitters of XQ14 and XQ15 are forced to C1+C2 (lines 122 and 123). Switching transistor XQ16 is encountered in moving up the branch of circuit 100 from the collector of XQ11. The emitter of XQ16 is forced to (C1+C2)' (line 124). Turning to transistor XQ14, we note that the base of XQ14 is assigned the value B1+B2 (line 125) per rule 98, as it is connected to the input translator IT2 with multiple inputs B1 and B2. Accordingly, the value at the collector of XQ14 is determined to be (C1+C2)*(B1+B2) (line 126), in accordance with rule 92. Turning to transistor XQ15, we note that the base of XQ15 is assigned the value (B1+B2)' (line 127) per rule 95, as it is connected to bias signal VBB2 and is part of the same current switch as transistor XQ14. Accordingly, the value at the collector of XQ15 is determined to be (C1+C2)*(B1+B2)' (line 128), in accordance with rule 92 Turning to transistor XQ16, we note that the base of XQ16 is forced to the value of 1 (line 129) per rule 94, as it is connected to bias signal VBB2. With respect to transistor XQ16, bias signal VBB2 is recognized as functioning like a current source bias signal rather than a current switch bias signal. Accordingly, the value at the collector of XQ16 is determined to be (C1+C2)' (line 130), in accordance with rule 92.

Switching transistors XQ17, XQ18 and XQ19 are next encountered as the circuit 100 branches from the collector of XQ14. The emitters of XQ17, XQ18 and XQ19 are forced to (C1+C2)*(B1+B2) (lines 131, 132 and 133), the value at the collector of XQ14. Supernode SP25 and then switching transistor XQ20 are encountered in moving up the branch of circuit 100 from the collectors of XQ15 and XQ16. The value at supernode SP25 is determined to be (C1+C2)*((B1+B2)')+(C1+C2)' (line 134), which is the OR of the values at the collectors of XQ15 and XQ16 in accordance with rule 96. Turning now to transistor XQ17, we note that the base of XQ17 is forced to A1 (line 135), as it is connected to input A1. Accordingly, the value at the collector of XQ17 is determined to be ((C1+C2)*(B1+B2))*(A1) (line 136), in accordance with rule 92. Turning now to transistor XQ18, we note that the base of XQ18 is forced to A2 (line 137), as it is connected to input A2. Accordingly, the value at the collector of XQ18 is determined to be ((C1+C2)*(B1+B2))*(A2) (line 138), in accordance with rule 92.

Turning now to transistor XQ19, we note that the base of XQ19 is assigned the value of (A1+A2)' (line 139) per rule 95, as it is connected to current switch bias signal VBB1 and is part of the same current switch as transistors XQ17 and XQ18 with inputs A1 and A2 at their respective bases. Accordingly, the value at the collector of XQ19 is determined to be ((C1+C2)*(B1+B2))*((A1+A2)') (line 140), in accordance with rule 92. Turning now to switching transistor XQ20, we note that XQ20 is encountered in moving up the branch from the supernode SP25. Hence, the logical value of the emitter of XQ20 is (C1+C2)*((B1+B2)')+(C1+C2)' (line 141), the same value as at supernode SP25 to which it is connected. The base of XQ20 is forced to the value of 1 (line 143) per rule 94, as it is connected to bias signal VBB1. With respect to transistor XQ16, bias signal VBB1 functions as a current source bias signal rather than a current switch bias signal. Accordingly, the value at the collector of XQ20 is determined to be (C1+C2)*((B1+B2)')+(C1+C2)' (line 144), in accordance with rule 92.

Consider now the value at supernode SP27, to which the collectors of transistors XQ17 and XQ18 are connected. The value at supernode SP27 is determined to be $$((C1+C2)*((B1+B2))*(A1)+((C1+C2)*(B1+B2))*(A2)$$

(line 142), which is the OR of the values at the collectors of XQ17 and XQ18 in accordance with rule 96. This same value appears at the base of transistor XQ21 in the output emitter follower OEF1 (line 145) and at the father terminal of load resistor RL1 (line 146), both of which are connected to supernode SP27 Note that the output emitter follower OEF1 includes output ZN.

Consider now the value at supernode SP28, to which the collectors of transistors XQ19 and XQ20 are connected. The value at supernode SP28 is determined to be $$((C1+C2)*(B1+B2))*((A1+A2)')+(C1+C2)*((B1+B2)')+(C1+C2)'$$

(line 147), which is the OR of the values at the collectors of XQ19 and XQ20 in accordance with rule 96. This same value appears at the base of transistor XQ22 in the output emitter follower OEF2 (line 148) and at the father terminal of load resistor RL2 (line 149), both of which are connected to supernode SP28. Note that the output emitter follower OEF2 includes output Z.

The step 36 of generating the boolean equation table for each node of the circuit culminates in the generation of the output logic string. The output logic strings for the outputs Z-N and Z of the circuit of FIG. 4 are given in FIG. 9G under the heading "Output Logic String." The value of the output ZN is $$(((C1+C2)*((B1+B2))*(A1)+((C1+C2)*(B1+B2))*(A2))'$$

(line 150), which is the complement of the logical value assignment of the base of transistor XQ21 of the output emitter follower OEF1 per rule 99. The value of the output Z is $$(((C1+C2)*(B1+B2))*((A1+A2)')+(C1+C2)*((B1+B2)')+(C1+C2)')'$$

(line 151), which is the complement of the logical value assignment of the base of transistor XQ22 of the output emitter follower OEF2 per rule 99. Every node of the circuit of FIG. 4 has been taken into account in generating the Boolean equations for the outputs Z and ZN.

The operation and general content of program VLOG.C pertinent to the generation of test vector stimuli and the generation and confirmation of a truth table for the gate-level model (FIG. 2, steps 38 and 40 respectively) are now discussed. The test vector stimuli are obtained (step 38) from the truth table file for the macrocell. An example of a truth table file for the macrocell OAI32DT is given in FIG. 5 under the filename OAI32DT.TRU. Line 160 starts with he required word "COMP:" followed by pairs of complementary output names joined with a plus sign. If a particular output pin name does not have a complementary output, the name itself is provided without a plus sign. Line 162 is used for macros having twin outputs. When used, it starts with the required word "TWIN:" followed by pairs of twin output manes joined with a plus sign. Line 164 lists all of the input pin names, then a vertical bar, then all of the output pin names. The vertical bar separates the input pin names from the output pin names. Lines 166 are rows of data with each value matching the input names and output names in its respective column. The conventions used in the truth table are as follows:

TABLE 3

| Code | Meaning |
| --- | --- |
| H | high |
| L | low |
| X | high/low |
| * | undefined |
| Z | high impedance |

In carrying out step 38 on the file OAI32DT.TRU, the test vector stimuli file is taken from the input data provided in columns 168; see FIGS. 9AE and 9AF under the heading "Vector File Before Sorting." The columns are sorted in order to facilitate the truth table generation and confirmation step 40; see FIG. 9AF under the heading "Vector File After Sorting."

In step 40, the test vector stimuli obtained in step 38 is applied to the output logic strings to obtain a program-generated truth table. In performing the truth table generation phase of step 40, the inputs to the macrocell circuit are assigned successive sets of stimuli, and the logical state of the outputs determined for each set of stimuli. For the circuit of FIG. 3, for example, inputs A1, A2, B1, B2, C1 and C2 are varied and the output values determined in accordance with the output logic string Boolean equations of FIG. 9G, "Output Logic String." This program-generated truth table, see FIG. 9G under the heading "Truth Table Generated by Program," is compared with the user-supplied truth table, see FIG. 9G under the heading "Truth Table Read In from File OAI32DT.TRU," in order to confirm that the output logic strings are logically correct.

The operation and general content of program VLOG.C pertinent to the generation of a gate-level netlist (FIG. 2, step 42) are now discussed. The output logic strings are reformatted into a gate-level netlist represented in the form of OR, NOR, AND, NAND, NOT, and BUF gates, as shown in FIGS. 9AD-9AE under the heading "ZN Before Reducing" and in Figures under the heading "Z Before Reducing." In order to reduce the file size of the gate-level netlist, redundant information is removed from the reformatted output logic strings in accordance with a set of rules such as, for example, the following.

TABLE 4

| | |
| --- | --- |
| Rule 1: | If different lines specify the same inputs, change all output names to the same name and eliminate redundant lines. |
| Rule 2: | If a first line and a second line have the same logical operator and, in addition, the result of the first line is an operand of the second line, substitute the operandi of the first line in the second line and eliminate the first line. |
| Rule 3: | If a second line is a NOT operation with its operand being the result of a first line, change the operand of the second line to a NOT of the logical operator of the first line, substitute the operandi of the first line in the second line, and eliminate the first line. |
| Rule 4: | The OR of an operand and ZERO is the operand. |
| Rule 5: | The AND of an operand and ONE is the operand. |

For example, in the list "ZN Before Reducing" of FIG. 9AD, Rule 1 allows the elimination of line 188 in view of line 180 and line 190 in view of line 182 (N_5 being renamed N_1 and N_6 being renamed N_2); Rule 2 allows the elimination of line 184 upon revision of line 186 (see line 196); and Rule 3 allows the elimination of line 192 upon revision of line 194 (see line 198). The reduced reformatted output logic strings for the circuit OAI32DT are shown in FIGS. 9AD and 9AE under the headings "ZN After Reduction" and "Z After Reduction."

It is desirable to perform logic checks to confirm that the reduction is properly done. Accordingly, the test vector stimuli previously obtained and applied to the output logic string is also applied to the reduced reformatted output logic strings both before reduction (line 200 of FIG. 9AD and line 204 FIG. 9AE and after reduction (line 202 of FIG. 9AD line 206 of FIG. 9AE), and the resulting vectors compared. A proper reduction is indicated by an exact match of the vectors before reduction and after reduction.

The gate-level netlist is formed by combining the individual reformatted output logic strings after reduction. In addition, a further reduction is performed to reduce complemented outputs. For example, output ZN is represented by the gate-level netlist segment 208 of FIG. 9AE, while output Z is reduced to the NOT of output ZN, as shown in line 210 of FIG. 9AE. Hence, the full gate-level netlist suitable for the simulation model library 926 is segment 208 and line 210.

Note that one of the lists included in the intermediate file macroname.OUT for debugging purposes is full "biographical" data for each node of the circuit. For the macrocell OAI32DT, for example, the biographical data is shown in FIGS. 9H-9AA under the heading "Individual Node." Each entry of biographical data includes a number of fields. Field "Nodename" contains a string identifying the name of a component vertex at a given circuit node. Field "Nodeid" contains either the string ROOT, SUPERNODE, PRSON, FEMALE, or MALE identifying the type of node. A "ROOT" node is defined as a VSSEE terminal. A "SUPERNODE" node is defined as a circuit node to which two or more collectors are tied. A "PRSON" node is defined as the base of an OEF transistor, or the base of a transistor tied either to VCC, to one vertex of a resistor whose other vertex is tied to VCC, or to the emitter of a transistor whose base and collector are tied to VCC (as in a clamp diode). A "FEMALE" node is defined as a transistor base not a PRSON. A "MALE" node is defined as a transistor emitter or an otherwise undefined node. Field "Circ_Node" contains an integer identifying the circuit node number. Field "Logicstr" contains a string representing the logical value at the node. Field "Father" contains a string providing the name of the component vertex from which the component vertex identified by "Nodename" depends, in the direction of the root. Field "Fath-Son" contains a string specifying the relationship between "Nodename" and "Father" : BLOOD if vertices of the same component at different circuit nodes, ADOPT if vertices of different components at the same circuit node. Field "Brother" contains a linked list of records identifying all emitters tied at the same circuit node, or the collector of the same transistor as a base specified in "Nodename." Field "Child" contains a linked list of records of children "Children" is defined for a resistor as the node "D" farthest from the root, for a MALE transistor collector and a MALE resistor vertex "D" as all other vertices at the given circuit node, and for a transistor emitter as the collector and base of the same transistor. Field "Sister" contains a string identifying for a transistor collector the base of the same transistor. Field "Cousin" contains a linked list of records identifying for a transistor collector at a supernode the other transistor collectors at the given supernode. Field "Logic_Val" contains an integer identifying a conventional logical value of ONE or ZERO if possible, and otherwise a negative one if undefined. For example, the root VSSEE is assigned the logical value of ONE, and the collector of the current source connected to the root is assigned the logical value of ONE.

The operation and general content of program VLOG.C pertinent to the generation of a Verilog simulation model (FIG. 2, step 44) basically involves appending a modified AC specification to the gate-level netlist file, as is known in the art. A Verilog simulation model for the circuit OAI32DT is shown in FIG. 8, with the gate-level netlist being shown at FIG. 8D the appended AC information being shown at FIGS. 8A. The file OAI32DT.VMOD of FIG. 8 is suitable addition to the Verilog simulation model library 926.

The Verilog simulation model, which is contained in file macroname.VMOD, preferably is tested prior to incorporation into the simulation model library 926. Vectors for testing the Verilog simulation model macroname.VMOD are contained in the intermediate file macroname.VEC. Other information for testing the Verilog simulation model is contained in the intermediate file macroname.VTB. These intermediate files are not used in the simulation of customer options.

The method illustrated in FIG. 2 has been implemented in computer programs, including those listed in Parts 1-14 of the Appendix, on a VAX (Trademark) model 8650 computer available from Digital Equipment Corporation of Maynard, Mass., running under the VMS (Trademark) operating system.

Figure 16:
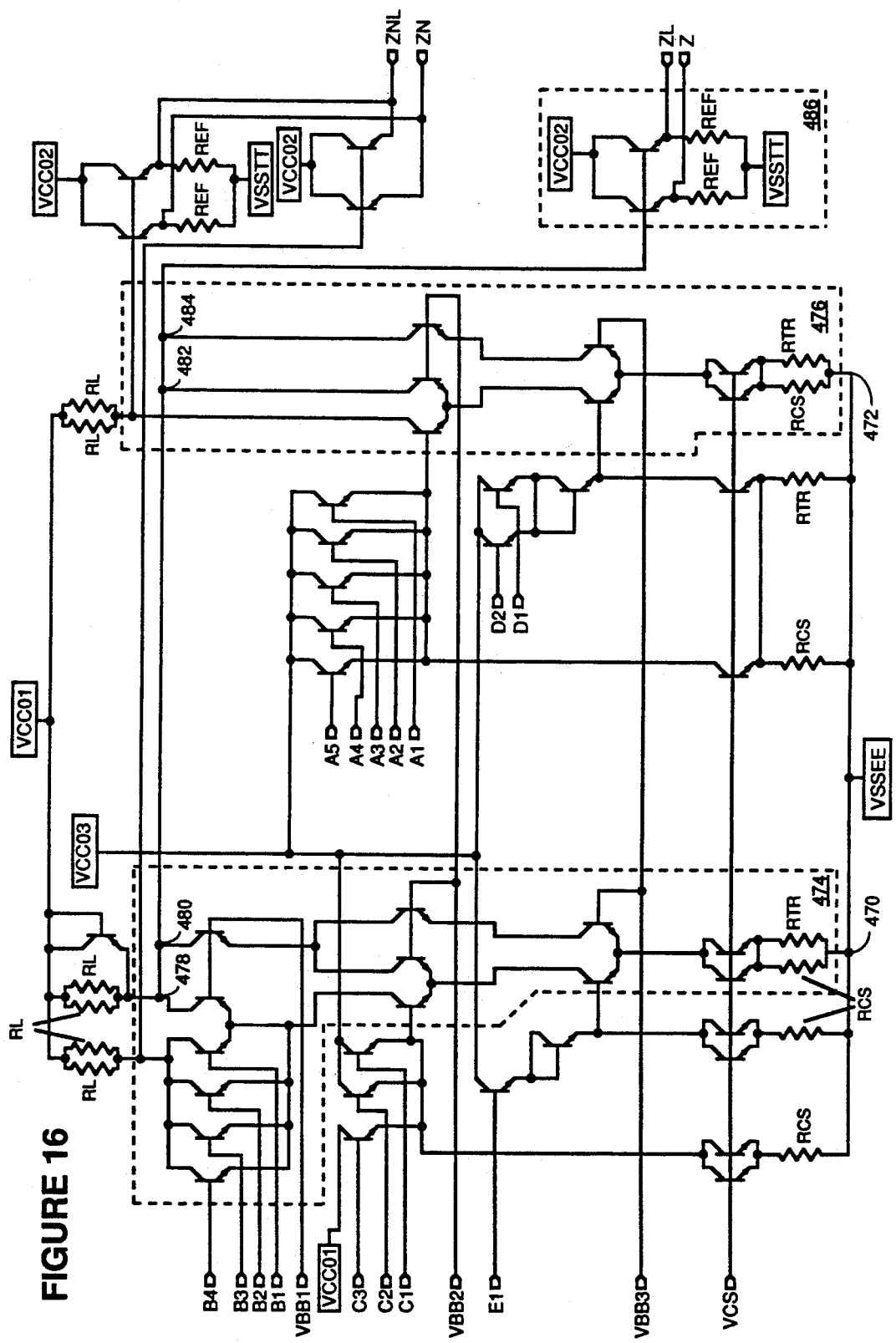
FIG. 16 is a circuit schematic of another exemplary macrocell.

While we have discussed the method of FIG. 2 in the context of a macrocell having only a single main circuit segment and hence only a single root, it will be appreciated that the method of FIG. 2 is equally applicable to ECL macrocells of any complexity, whether very simple or complex and having multiple roots Consider, for example, the macrocell OAI55DT shown schematically in FIG. 16. Macrocell OAI55DT is an OR-AND-INVERT function with two true roots, indicated at 470 and 472. Trees 474 and 476, which correspond respectively to roots 470 and 472, are traversed sequentially. Note that the trees 474 and 476 together generate a supernode consisting of collectors 478, 480, 482 and 484 tied to the base of output emitter follower 486, which furnishes outputs Z and ZL. The results of the application of the method of FIG. 2 to the macrocell OAI55DT are shown in Parts 15-23 of the Appendix.

While our invention has been described with respect to the embodiments set forth above, other embodiments and variations not described herein are within the scope of my invention. For example, our invention is applicable to combinatorial circuits other that ECL, provided that these combinatorial circuits have components arranged in specific relationships. Accordingly, other embodiments and variations not described herein are to be considered within the scope of my invention as defined by the following claims.

What is claimed is:

1. A method for generating a gate-level netlist for a macrocell simulation model from a physical layout of said macrocell, comprising the steps of:
   generating a circuit-level netlist from a physical layout of said macrocell;
   identifying each true root present in said circuit-level netlist;

for each true root identified, identifying from said circuit-level netlist successive circuit nodes of a tree associated therewith;

for each of said successive circuit nodes of a tree, successively determining a respective Boolean equation based on circuit elements connected thereto, in accordance with a set of relationship rules pertinent to circuit elements of said macrocell and a set of logical value assignment definition rules, said identified circuit nodes including a set of output nodes; and converting the Boolean equation for said set of output nodes into a gate-level netlist.

2. A method as in claim 1, wherein said Boolean equation conversion step comprises the step of converting said Boolean equations into a set of logical operator expressions.

3. A method as in claim 2, wherein said Boolean equation conversion step further comprising the step of reducing said logical operator expressions.

4. A method as in claim 3, wherein said Boolean equation conversion step further comprises the steps of:
generating a first truth table from said set of logical operator expressions;
generating a second truth table from said reduced set of logical operator expressions; and
comparing said first and second truth tables to confirm the reduction.

5. A method as in claim 1, further comprising the steps of:
generating a truth table from the Boolean equations for said set of output nodes; and
comparing said generated truth table to a known correct truth table to confirm the Boolean equations for said set of output nodes.

6. A method as in claim 1, wherein said step of identifying from said circuit-level netlist successive circuit noes of a tree comprises traversing said tree in a depth-first traversal.

7. A method as in claim 1, wherein said step of identifying from said circuit-level netlist successive circuit nodes of a tree comprises traversing said tree in a breadth-first traversal.

8. A method as in claim 1, wherein:
said relationship rules are relationship rules pertinent to a transistor and resistor of an ECL-type circuit, and specify that:
for a resistor having two terminals, the terminal closest said root is the "father" and the other terminal is the "son;" and
for a transistor having three terminals, the emitter terminal is the "father," the base terminal is the "daughter," and the collector terminal is the "son;" and said logical value assignment definition rules are definition rules pertaining to an ECL-type circuit, and specify that:
for a resistor, the logical value of the son equals the logical value of the father;
for a transistor, the logical value of the collector equals the AND of the logical value of the emitter and the logical value of the base;
the logical value of a root is ONE;
the logical value of a bias signal for a current source equals ONE;
the logical value of a bias signal for a current switch equals the complement of the logical value of the base of a switching transistor associated with said current switch;
the logical value of a supernode equals the OR of the logical values of all collectors tied to said supernode;
the logical value of an input translator with plural inputs equals the OR of the logical values of said plural inputs; and
the logical value of an output node equals the complement of the logical value of a base of a transistor associated with said output node.

9. A method as in claim 1, further comprising the step of preprocessing said circuit-level netlist prior to said circuit node identifying step, said Boolean equation determining step, and said Boolean equation conversion step.

10. A method as in claim 9, wherein said preprocessing step comprises the steps of: extracting parallel transistors and resistors; preprocessing output emitter followers; and preprocessing input transistors.

11. An apparatus for generating a gate-level netlist for a macrocell simulation model from a physical layout of said macrocell, comprising:
a data storage device for storing a physical layout of said macrocell;
means for generating a circuit-level netlist from said physical layout of said macrocell accessed from said data storage device;
means for identifying each true root present in said circuit-level netlist;
means for identifying from said circuit-level netlist, for each true root identified, successive circuit nodes of a tree associated therewith;
means for successively determining, at each of said successive circuit nodes, a Boolean equation based on circuit elements connected thereto, in accordance with a set of relationship rules pertinent to circuit elements of said macrocell and a set of logical value assignment definition rules, said identified circuit nodes including a set of output nodes; and
means for converting the Boolean equations for said set of output nodes into a gate-level netlist.

* * * * *